(12) United States Patent
Tsai et al.

(10) Patent No.: US 11,495,573 B2
(45) Date of Patent: Nov. 8, 2022

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 221 days.

(21) Appl. No.: 16/805,838

(22) Filed: Mar. 2, 2020

(65) Prior Publication Data
US 2021/0272929 A1  Sep. 2, 2021

(51) Int. Cl.
| | | |
|---|---|---|
| H01L 25/065 | (2006.01) | |
| H01L 23/31 | (2006.01) | |
| H01L 23/538 | (2006.01) | |
| H01L 21/56 | (2006.01) | |
| H01L 23/00 | (2006.01) | |
| H01L 25/00 | (2006.01) | |
| H01L 21/48 | (2006.01) | |
| H01L 23/13 | (2006.01) | |

(52) U.S. Cl.
CPC ...... *H01L 25/0652* (2013.01); *H01L 21/4853* (2013.01); *H01L 21/4857* (2013.01); *H01L 21/56* (2013.01); *H01L 23/13* (2013.01); *H01L 23/3128* (2013.01); *H01L 23/3135* (2013.01); *H01L 23/3142* (2013.01); *H01L 23/5385* (2013.01); *H01L 23/5386* (2013.01); *H01L 24/19* (2013.01); *H01L 24/24* (2013.01); *H01L 24/82* (2013.01); *H01L 25/50* (2013.01); *H01L 2224/24137* (2013.01); *H01L 2224/24145* (2013.01); *H01L 2224/82101* (2013.01); *H01L 2225/06548* (2013.01); *H01L 2225/06586* (2013.01)

(58) Field of Classification Search
CPC ....... H01L 25/0652; H01L 2224/24137; H01L 24/82; H01L 23/5386; H01L 24/19; H01L 21/56; H01L 23/3135; H01L 23/3142
See application file for complete search history.

(56) References Cited

U.S. PATENT DOCUMENTS 8,993,380 B2  3/2015 Hou et al.
9,000,584 B2  4/2015 Lin et al.
(Continued)

*Primary Examiner* — Thanh Y. Tran
(74) *Attorney, Agent, or Firm* — JCIPRNET

(57) ABSTRACT

A package structure includes a first semiconductor die, a second semiconductor die, a redistribution circuit structure, and a semiconductor device. The redistribution circuit structure has a first surface and a second surface opposite to the first surface, where the first surface is in contact with the first semiconductor die and the second semiconductor die, and the redistribution circuit structure is disposed on and electrically connected to the first semiconductor die and the second semiconductor die. The redistribution circuit structure includes a recess extending from the second surface toward the first surface. The semiconductor device is located in the recess and electrically connected to the first semiconductor die and the second semiconductor die through the redistribution circuit structure.

20 Claims, 30 Drawing Sheets

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2011/0254160 A1* | 10/2011 | Tsai ................ H01L 23/13 |
| | | 257/738 |
| 2017/0047308 A1* | 2/2017 | Ho .................. H01L 24/17 |
| 2021/0005542 A1* | 1/2021 | Mallik ............. H01L 24/92 |

\* cited by examiner

PACKAGE STRUCTURE AND
MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
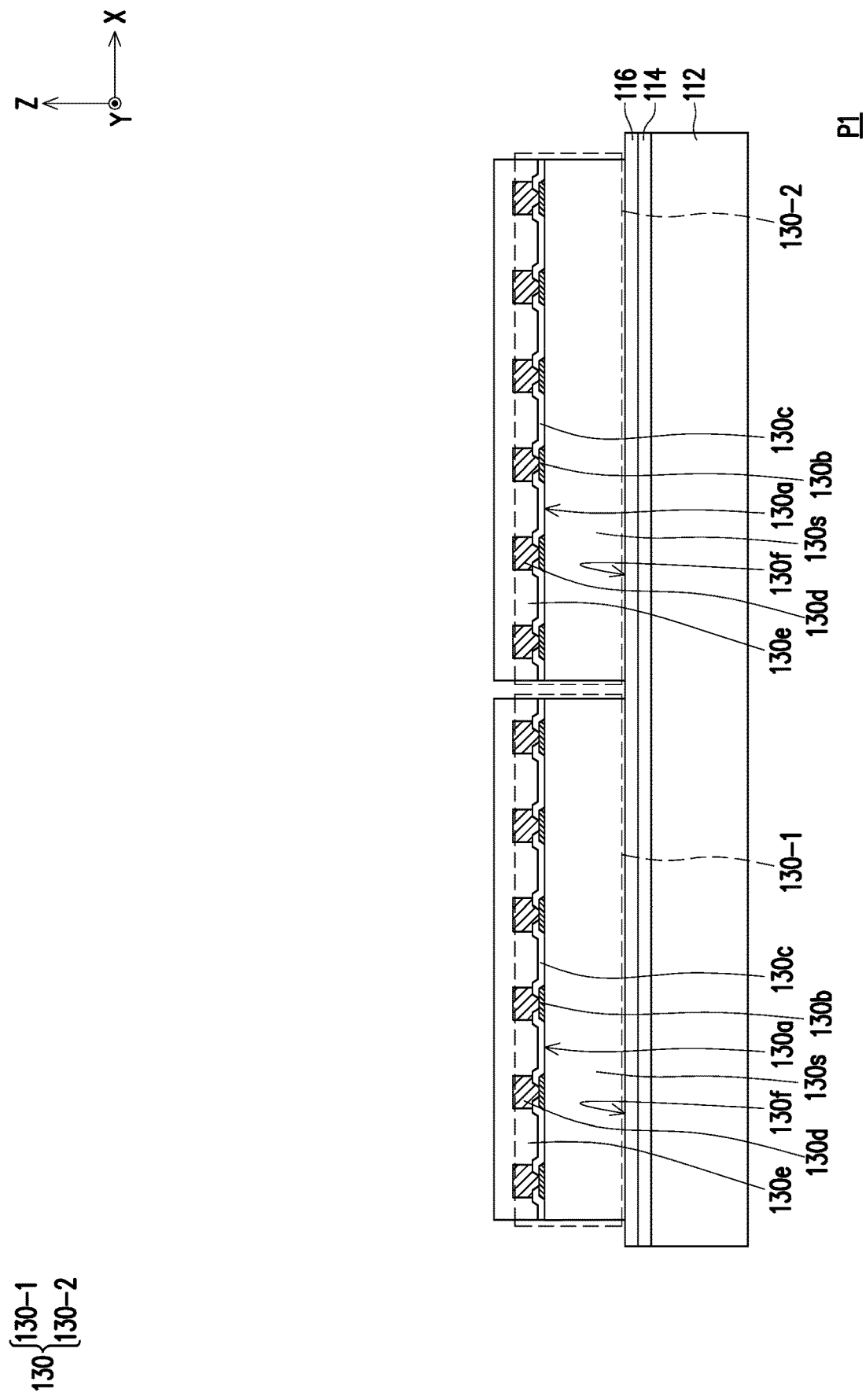
FIG. 1 to FIG. 13 are schematic cross-sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 27:
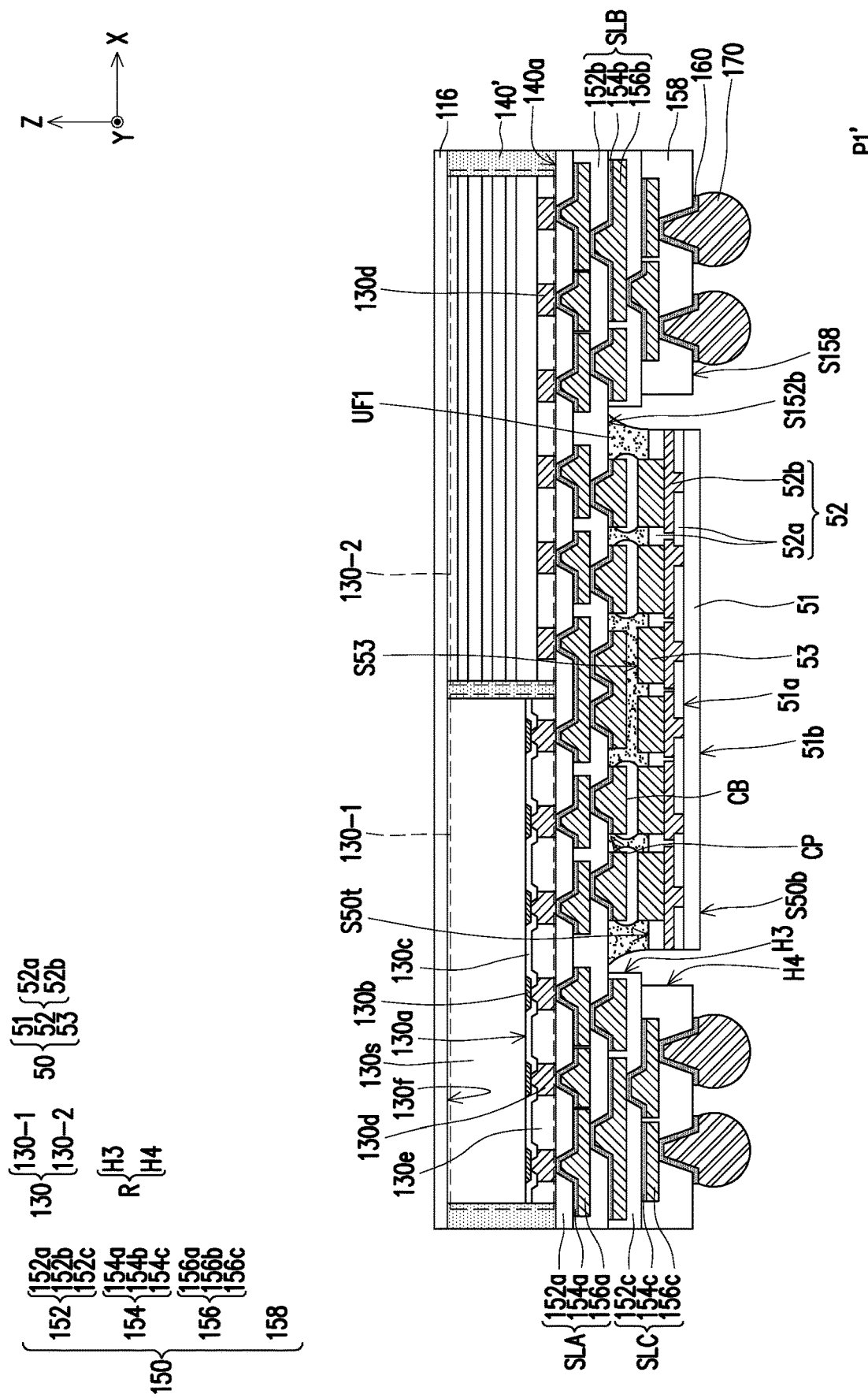
FIG. 27 is a schematic cross-sectional view of a package structure in accordance with some exemplary embodiments of the disclosure.
Figure 28:
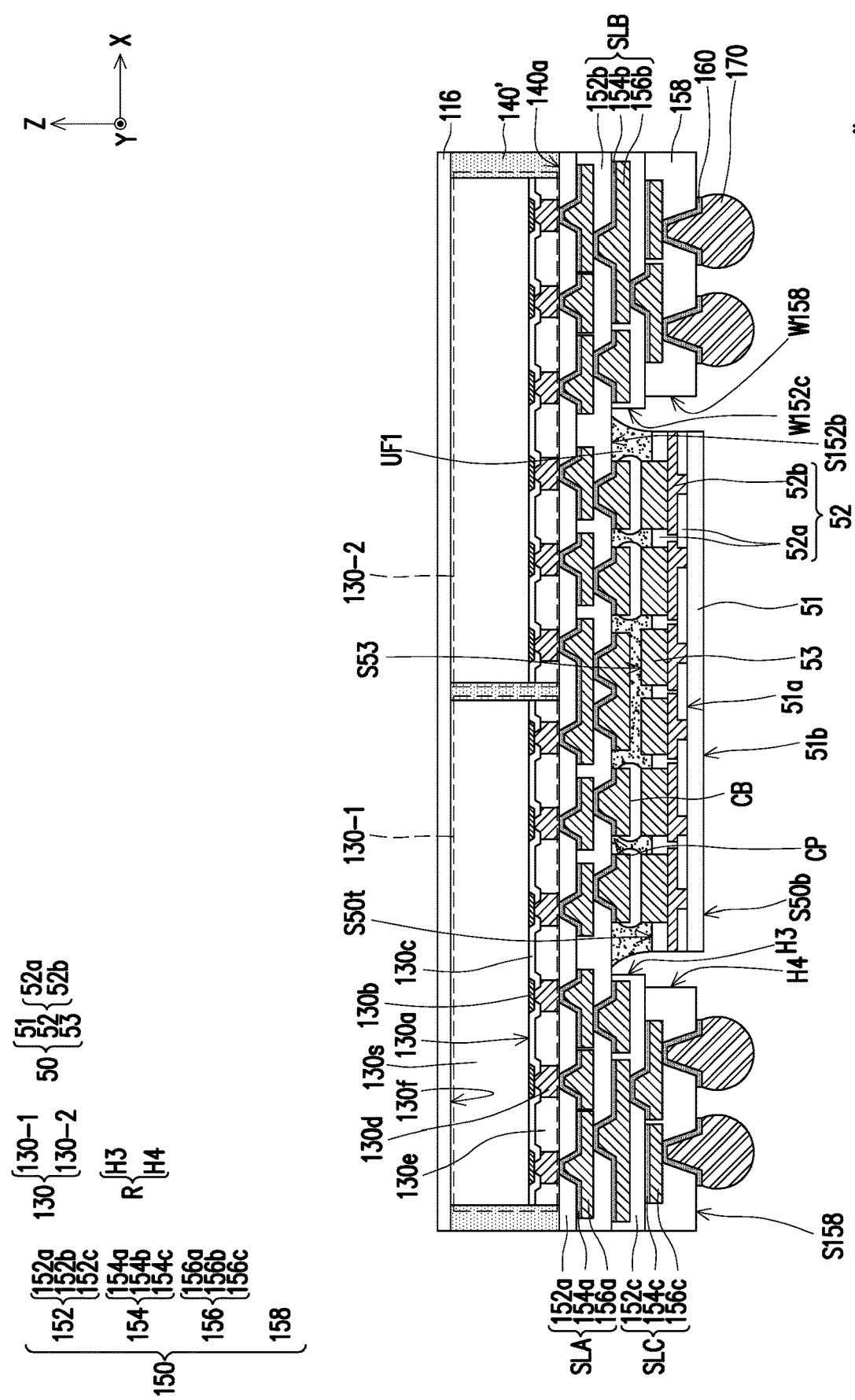
FIG. 28 is a schematic cross-sectional view of a package structure in accordance with some exemplary embodiments of the disclosure.

FIG. 1 to FIG. 13 are schematic cross-sectional views of various stages in a manufacturing method of a package structure in accordance with some embodiments of the disclosure. FIG. 14 to FIG. 17 are schematic top views respectively illustrating a relative position between semiconductor dies of a package structure according to some embodiments of the disclosure. FIG. 27 is a schematic cross-sectional view of a package structure in accordance with some exemplary embodiments of the disclosure. FIG. 28 is a schematic cross-sectional view of a package structure in accordance with some exemplary embodiments of the disclosure. In some embodiments, the manufacturing method is part of a packaging process. In FIG. 1 to FIG. 13, multiple (semiconductor) chips or dies are shown to represent plural (semiconductor) chips or dies of the wafer, and one (semiconductor) package structure are shown to represent plural (semiconductor) package structures obtained following the (semiconductor) manufacturing method, the disclosure is not limited thereto. In an alternative embodiment, one (semiconductor) chip or die may be shown to represent plural (semiconductor) chips or dies of the wafer, and one or more than one (semiconductor) package structure may be shown to represent plural (semiconductor) package structures obtained following the (semiconductor) manufacturing method.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g. the buffer layer 116) or any wafer(s) disposed thereon (e.g. the carrier 112). In some embodiments, the debond layer 114 may include a release layer (such as a light-to-heat conversion ("LTHC") layer) or an adhesive layer (such as an ultra-violet curable adhesive or a heat curable adhesive layer). The top surface of the debond layer 114 may be levelled and may have a high degree of coplanarity.

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide (PI), polybenzoxazole (PBO), benzocyclobutene (BCB), or any other suitable polymer-based dielectric material. In some embodiments, the buffer layer 116 may be Ajinomoto buildup film (ABF), solder resist film (SR), or the like. The top surface of the buffer layer 116 may be levelled and may have a high degree of coplanarity.

For example, the debond layer 114 and the buffer layer 116 may be formed by a suitable fabrication technique such as spin-coating, lamination, deposition, or the like. The disclosure is not specifically limited thereto. In an alternative embodiment, the buffer layer 116 may be omitted.

In some embodiments, at least one semiconductor die 130 is provided. As shown in FIG. 1, for example, the at least one semiconductor die 130 includes a plurality of semiconductor dies, such as a semiconductor die 130-1 and a semiconductor die 130-2. In some embodiments, the semiconductor die 130-1 and the semiconductor die 130-2 are picked and placed over the carrier 112 and disposed on the buffer layer 116. For example, as shown in FIG. 1, the semiconductor die 130-1 and the semiconductor die 130-2 are arranged aside to each other along a direction X, and the direction X is perpendicular to a stacking direction Z of the carrier 112, the debond layer 114, the buffer layer 116 and the semiconductor dies 130. As shown in FIG. 1, the semiconductor dies 130 included only two semiconductor dies 130 (e.g., the semiconductor die 130-1 and the semiconductor die 130-2) are presented for illustrative purposes, however, it should be noted that the number of the semiconductor dies 130 may be one or more than one, the disclosure is not limited thereto. However, the disclosure is not limited thereto; in an alternative embodiment, the semiconductor die 130-1 and the semiconductor die 130-2 may be arranged aside to each other along a direction Y, and the direction Y is perpendicular to the stacking direction Z, where the direction Y is different from the direction X. For example, the direction Y may be perpendicular to the direction X, as shown in FIG. 1. That is, the semiconductor die 130-1 and the semiconductor die 130-2 may be arranged into a M*N matric on a X-Y plane, where one of M and N is a positive integer greater than or equal to one and other one of M and N is a positive integer greater than or equal to two.

In some embodiments, the semiconductor die 130-1 and the semiconductor die 130-2 each include a semiconductor substrate 130s having an active surface 130a and a backside surface 130f opposite to the active surface 130a, a plurality of pads 130b distributed on the active surface 130a, a passivation layer 130c covering the active surface 130a and a portion of the pads 130b, a plurality of conductive vias 130d connecting to the pads 130b exposing by the passivation layer 130c, and a protection layer 130e disposed on and covering the passivation layer 130c and the conductive vias 130d. The pads 130b, the passivation layer 130c, the conductive vias 130d, and the protection layer 130e are formed on the semiconductor substrate 130s. The pads 130b are partially exposed by the passivation layer 130c, the conductive vias 130d are respectively disposed on and electrically connected to the pads 130b, and the protection layer 130e completely covers the conductive vias 130d and the passivation layer 130c exposed by the conductive vias 130d.

However, the disclosure may not be limited thereto. For example, the conductive vias 130d and the protection layer 130e may be omitted. In an alternative embodiment, the semiconductor die 130-1 and the semiconductor die 130-2 each may include the semiconductor substrate 130s having the active surface 130a and the backside surface 130f opposite to the active surface 130a, the plurality of pads 130b distributed on the active surface 130a, and the passivation layer 130c covering the active surface 130a and a portion of the pads 130b.

The semiconductor substrate 130s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130s may further include an interconnection structure (not shown) disposed on the active surface 130a. In certain embodiments, the interconnection structure may include one or more inter-dielectric layers and one or more patterned conductive layers stacked alternately for providing routing function to the active components and the passive components embedded in the semiconductor substrate 130s, where the pads 130b may be referred to as an outermost layer (away from the active surface 130a) of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 130b are aluminum pads or other suitable metal pads, for example. The conductive vias 130d are copper pillars, copper alloy pillar or other suitable metal pillars containing copper metal, for example. In some embodiments, the passivation layer 130c and the protection layer 130e may be a PBO layer, a PI layer or other suitable polymers. In some alternative embodiments, the passivation layer 130c and the protection layer 130e may be made of inorganic materials, such as silicon oxide, silicon nitride, silicon oxynitride, or any suitable dielectric material. The material of the passivation layer 130c can be the same or different from the material of the protection layer 130e, for example.

It is noted that, the semiconductor dies 130 (e.g. the semiconductor die 130-1 and the semiconductor die 130-2) each described herein may be referred as a semiconductor chip or an integrated circuit (IC). In an alternative embodiment, the semiconductor die 130-1 and the semiconductor die 130-2 described herein may be semiconductor devices. In certain embodiments, the semiconductor die 130-1 and the semiconductor die 130-2 may include one or more digital chips, analog chips or mixed signal chips, such as application-specific integrated circuit ("ASIC") chips, sensor chips, wireless and radio frequency (RF) chips, memory chips, logic chips or voltage regulator chips. In some embodiments, the logic chips independently may be a central processing unit (CPU), graphics processing unit (GPU), system-on-a-chip (SoC), microcontroller, or the like. In some embodiments, the memory chips independently may be a memory chip or device, such as a dynamic random-access memory (DRAM) die, static random-access memory (SRAM) die, hybrid memory cube (HMC) module, a high bandwidth memory (HBM) module, or the like. In further alternative embodiments, the semiconductor die 130-1 and the semiconductor die 130-2 may independently be referred to as a chip or an IC of combination-type, such as a WiFi chip simultaneously including both of a RF chip and a digital chip. The disclosure is not limited thereto.

In certain embodiments, the semiconductor dies 130 described herein, except for the semiconductor die 130-1 and the semiconductor die 130-2, may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto. In further alternative embodiments, the additional semiconductor die(s) may independently be referred to as a chip or an IC of combination-type, such as a WiFi chip simultaneously including both of a RF chip and a digital chip.

In the disclosure, it should be appreciated that the illustration of the semiconductor die 130-1 and the semiconductor die 130-2 and other components throughout all figures is schematic and is not in scale. In one embodiment, the semiconductor die 130-1 and the semiconductor die 130-2 may be the same, as shown in the package structure P1 depicted in FIG. 1 to FIG. 13, where the semiconductor die 130-1 and the semiconductor die 130-2 may both be a logic chip or the like. In an alternative embodiment, the semiconductor die 130-1 and the semiconductor die 130-2 may be different from each other, as shown in a package structure P1' depicted in FIG. 27, where the semiconductor die 130-1 may be a logic chip or the like while the semiconductor die 130-2 may be a HBM module (having the conductive vias 130d as the terminals for electrical connection to other component(s)) or the like.

Continued on FIG. 1, in some embodiments, the semiconductor dies 130 (e.g. the semiconductor die 130-1 and the semiconductor die 130-2) are directly disposed on the buffer layer 116, where the backside surface 130f of each of the semiconductor die 130-1 and the semiconductor die 130-2 are in physical contact with the buffer layer. However, the disclosure is not limited thereto.

In alternative embodiments, the buffer layer 116 may be optionally omitted from the debond layer 114, where each of the semiconductor dies 130 (e.g. the semiconductor die 130-1 and the semiconductor die 130-2) is then disposed on the debond layer 114 through a connecting film (not shown). In some embodiments, a first connecting film is located between the semiconductor die 130-1 and the debond layer 114, and two opposite sides of the first connecting film physically contacts the backside surface 130f of the semiconductor die 130-1 and the debond layer 114, respectively. In some embodiments, a second connecting film is located between the semiconductor die 130-2 and the debond layer 114, and two opposite sides of the second connecting film physically contacts the backside surface 130f of the semiconductor die 130-2 and the debond layer 114, respectively. In other words, the first and second connecting films each are respectively disposed only between the debond layer 114 and a respective one of the semiconductor dies 130 (e.g., 130-1 and 130-2). In some embodiments, due to the above connecting films, the semiconductor die 130-1 and the semiconductor die 130-2 are stably adhered to the debond layer 114. In some embodiments, the above connecting films may be, but not limited to, a die attach film (DAF) or a layer made of adhesives, epoxy-based resin, acrylic polymer, other suitable insulating material, or the like, and which may be with or without fillers filled therein (such as silica, alumina, or the like). The disclosure is not limited thereto.

Figure 2:
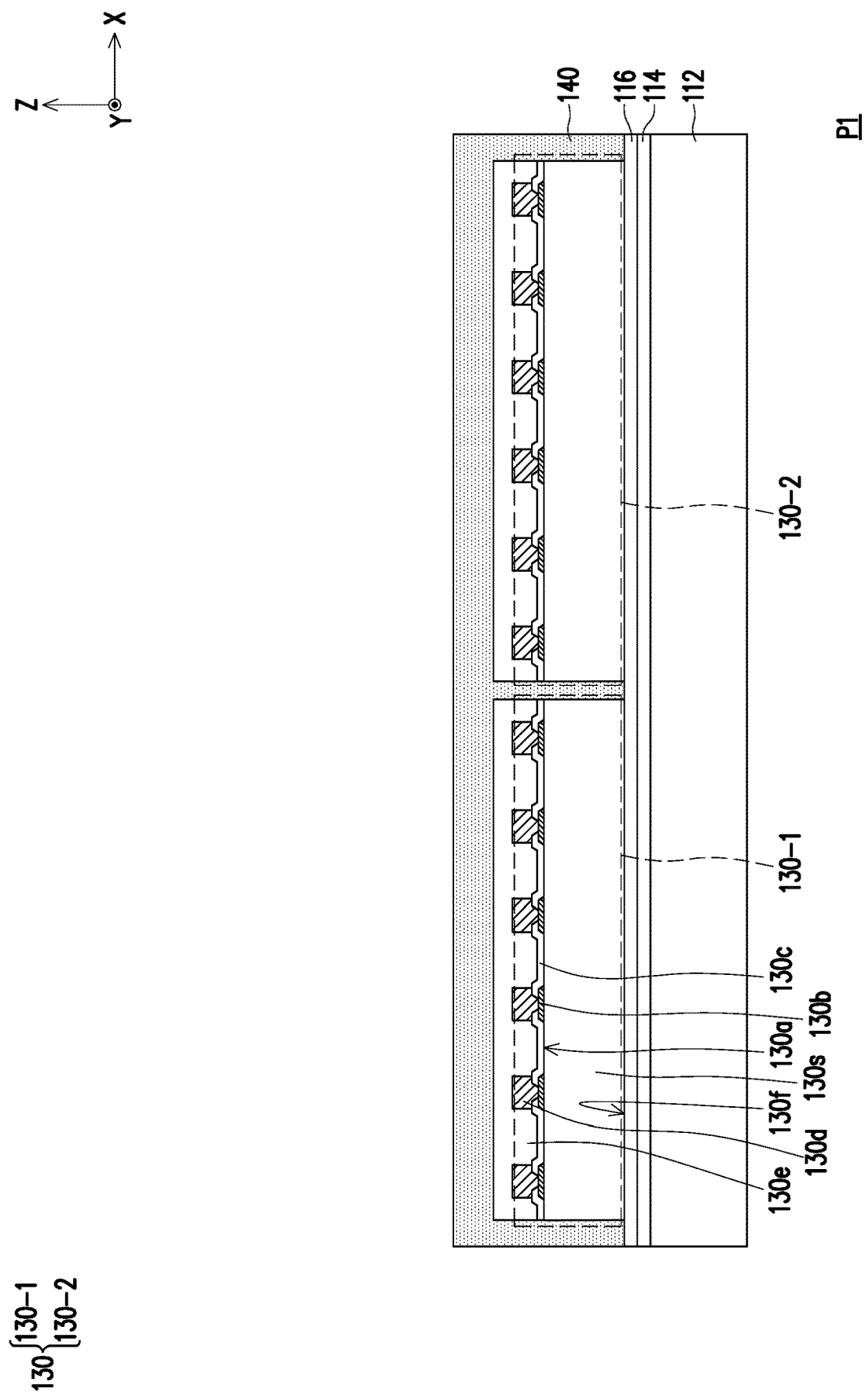

Referring to FIG. 2, in some embodiments, the semiconductor dies 130 are encapsulated in an insulating encapsulation 140. In some embodiments, the insulating encapsulation 140 is formed on the buffer layer 116 and over the carrier 112. As shown in FIG. 2, the insulating encapsulation 140 at least fills up the gaps between the semiconductor dies 130 (e.g. the semiconductor die 130-1 and the semiconductor die 130-2), for example. In some embodiments, the insulating encapsulation 140 covers the semiconductor dies 130. In other words, for example, the semiconductor dies 130 are not accessibly revealed by and embedded in the insulating encapsulation 140.

In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 3:
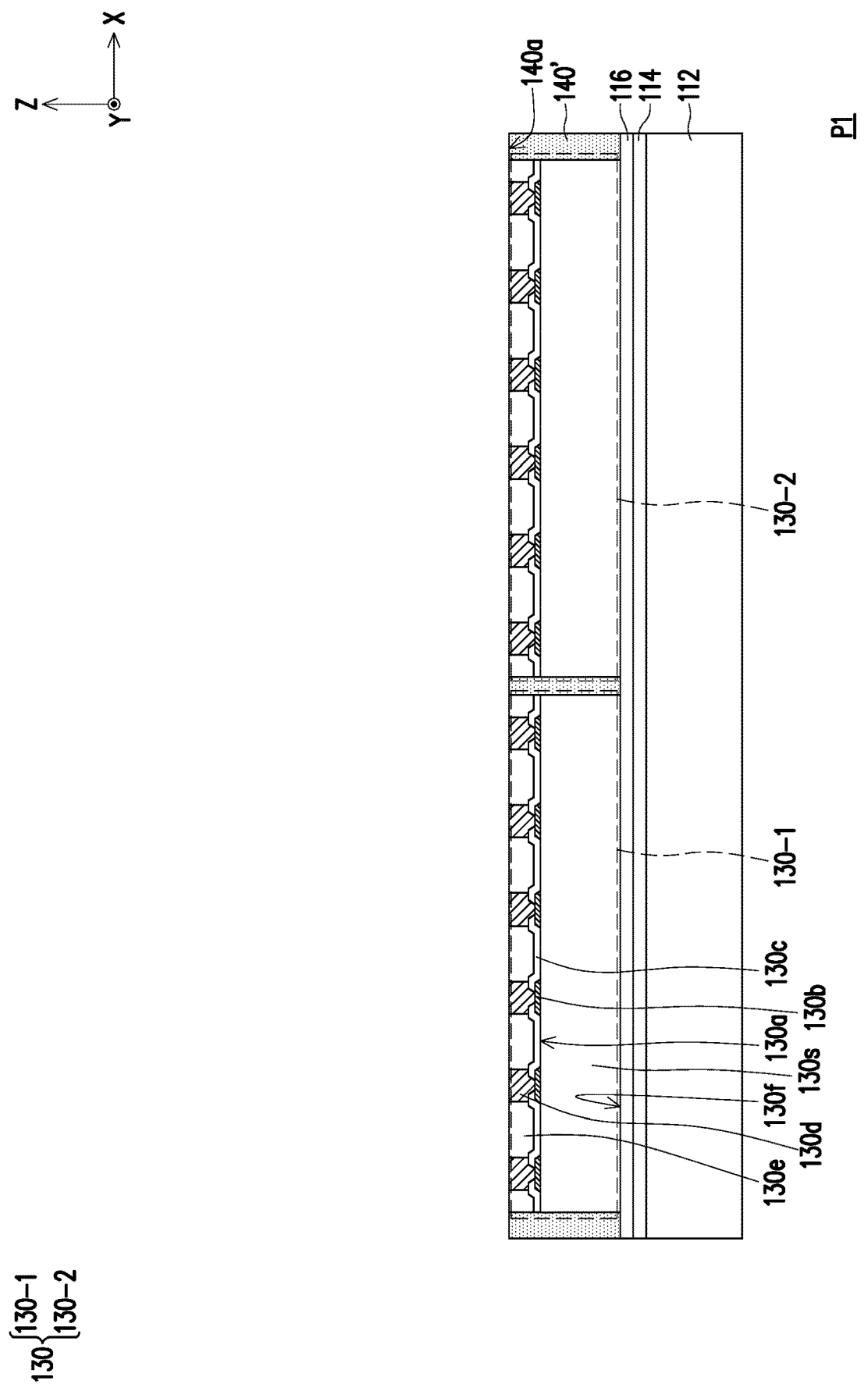

Referring to FIG. 3, in some embodiments, the insulating encapsulation 140 is planarized to form an insulating encapsulation 140' exposing the semiconductor dies 130. In certain embodiments, as shown in FIG. 3, after the planarization, top surfaces of the semiconductor dies 130 (e.g. top surfaces of the conductive vias 130d and the protection layer 130e of each of the semiconductor die 130-1 and the semiconductor die 130-2) are exposed by a top surface 140a of the insulating encapsulation 140'. That is, for example, the top surfaces of the semiconductor dies 130 become substantially leveled with the top surface 140a of the insulating encapsulation 140'. In other words, the top surfaces of the semiconductor dies 130 and the top surface 140a of the insulating encapsulation 140' are substantially coplanar to each other. In some embodiments, as shown in FIG. 3, the semiconductor dies 130 are accessibly revealed by the insulating encapsulation 140'. That is, for example, (the conductive vias 130d of) the semiconductor dies 130 are accessibly revealed by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor die 130-1 and/or the semiconductor die 130-2 may also be planarized. In certain embodiments, the planarizing step may be, for example, performed on the over-molded insulating encapsulation 140 to level the top surface 140a of the insulating encapsulation 140' and the top surfaces of the conductive vias 130d and the protection layer 130e of each of the semiconductor die 130-1 and the semiconductor die 130-2.

In some embodiments, a redistribution circuit structure 150 is formed on the semiconductor dies 130 and the insulating encapsulation 140'. In some embodiments, as shown in FIG. 4 to FIG. 10, the redistribution circuit structure 150 includes one or more than one dielectric layer 152 (e.g. a dielectric layer 152a, a dielectric layer 152b, and a dielectric layer 152c), one or more than one seed layer 154 (e.g. a seed layer 154a, a seed layer 154b, and a seed layer 154c), a one or more than one patterned conductive layer 156 (e.g. a patterned conductive layer 156a, a patterned conductive layer 156b, and a patterned conductive layer 156c), and a dielectric layer 158. However, in the disclosure, the numbers of layers of the dielectric layer 152, the seed layer 154, and the patterned conductive layer 156 are not limited to what is depicted in FIG. 4 to FIG. 10, and may be selected or designated based on the demand and/or design layout. In some embodiments, one dielectric 152, one seed layer 154 and one patterned conductive layer 156 are sequentially formed between the insulating encapsulation 140' and the dielectric layer 158 along the direction Z in a repeating manner.

Figure 4:
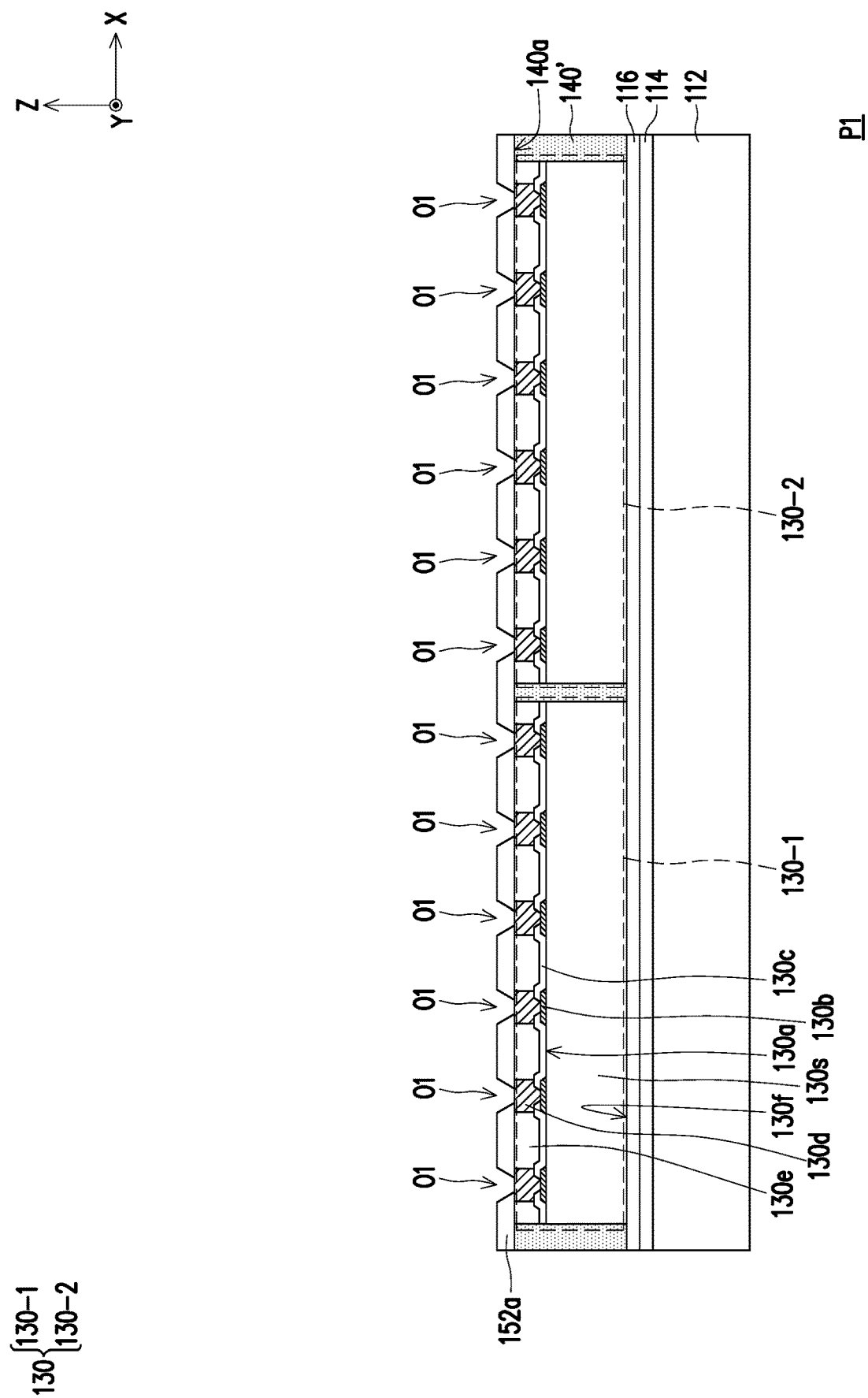

Referring to FIG. 4, in some embodiments, the dielectric layer 152a is formed on the insulating encapsulation 140' and the semiconductor dies 130. In some embodiments, the dielectric layer 152a is formed by, but not limited to, forming a blanket layer of dielectric material over the structure depicted in FIG. 3 to completely cover the insulating encapsulation 140' and the semiconductor dies 130, and patterning the dielectric material blanket layer to form the dielectric layer 152a. In some embodiments, during patterning the dielectric material blanket layer to form the dielectric layer 152a, openings O1 are formed in the dielectric material blanket layer to form the dielectric layer 152a. In other words, the conductive vias 130d of each of the semiconductor dies 130 are accessibly revealed by the dielectric layer 152a through the openings O1, respectively.

In some embodiments, the material of the dielectric layers 152a may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layer 152a may be formed by suitable fabrication techniques such as spin-on coating, chemical vapor deposition (CVD), (e.g. plasma-enhanced chemical vapor deposition (PECVD)), or the like. As shown in FIG. 4, the dielectric layer 152a is formed on the surface 140a of the insulating encapsulation 140' and the top surfaces of the conductive vias 130d and the protection layer 130e of each of the semiconductor die 130-1 and the semiconductor die 130-2, where the top surfaces of the conductive vias 130d and the protection layer 130e of each of the semiconductor die 130-1 and the semiconductor die 130-2 are at least partially exposed by the openings O1 formed in the dielectric layer 152a.

Figure 5:
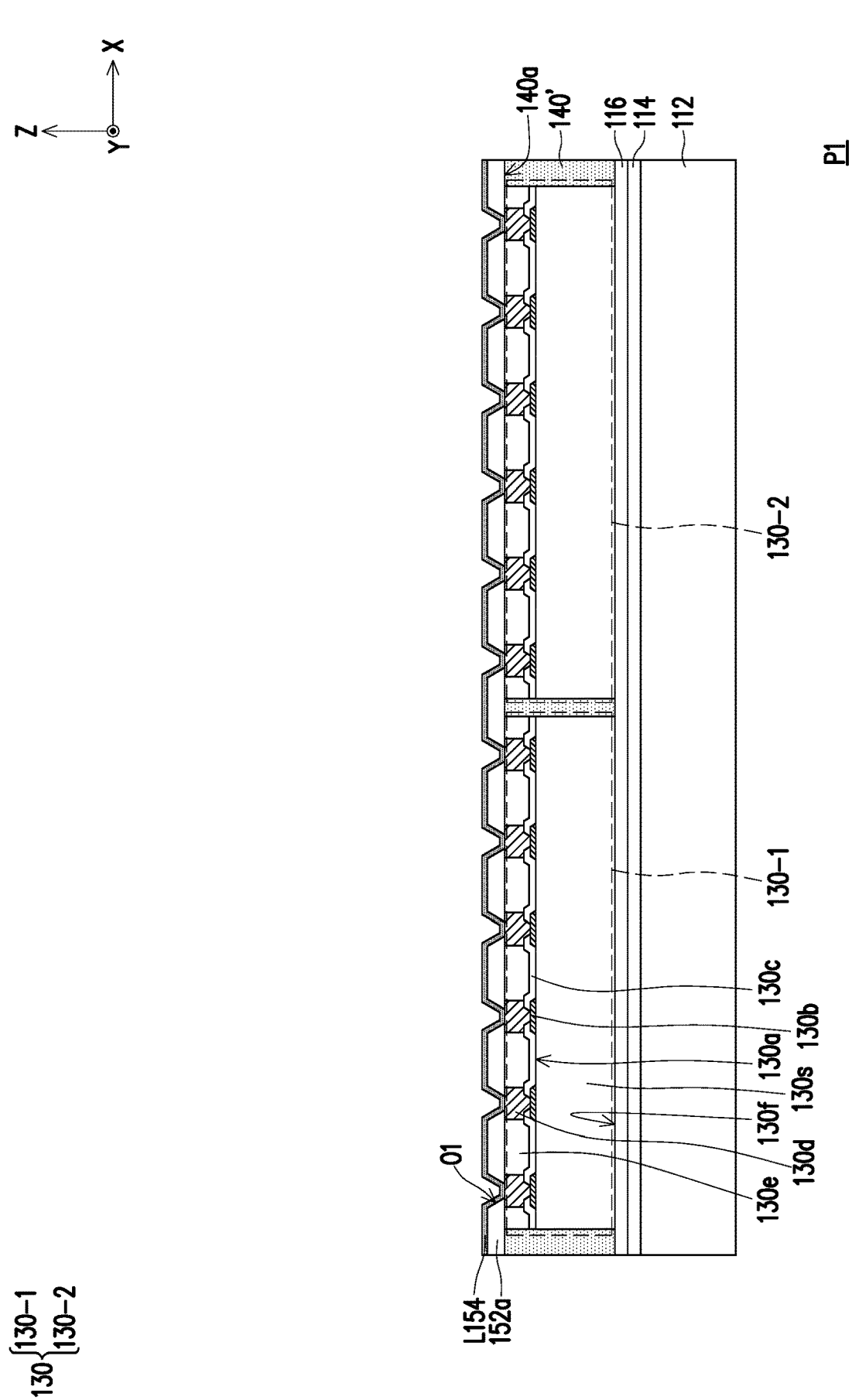

Referring to FIG. 5, in some embodiments, a seed layer L154 is formed over the dielectric layers 152a. In some embodiments, the seed layer L154 is formed on the dielectric layers 152a and extends into the openings O1 formed in the dielectric layer 152a to physically contact the conductive vias 130d of each of the semiconductor dies 130 exposed by the openings O1 and portions of the dielectric layer 152a (e.g. sidewalls of the openings O1). In other words, the seed layer L154 penetrates through the dielectric layer 152a, and the sidewalls and bottom surfaces of the openings O1 are completely covered by the seed layer L154.

In some embodiments, the seed layer L154 is conformally formed over the carrier 112 in a manner of a blanket layer made of metal or metal alloy materials, the disclosure is not limited thereto. In some embodiments, the seed layer L154 are referred to as a metal layer, which may be a single layer or a composite layer comprising a plurality of sub-layers formed of different materials. In some embodiments, the seed layer L154 include titanium, copper, molybdenum, tungsten, titanium nitride, titanium tungsten, combinations thereof, or the like. For example, the seed layer L154 may include a titanium layer and a copper layer over the titanium layer. The seed layer L154 may be formed using, for example, sputtering, physical vapor deposition (PVD). or the like. In some embodiments, the seed layer L154 may be conformally formed on the dielectric layer 152a by sputtering, and in contact with the dielectric layer 152a and the conductive vias 130d exposed by the openings O1. In some embodiments, the seed layer L154 is electrically connected to the semiconductor dies 130 via physically connecting the conductive vias 130d of each of the semiconductor dies 130 accessibly revealed by the dielectric layer 152a through the openings O1.

Figure 6:
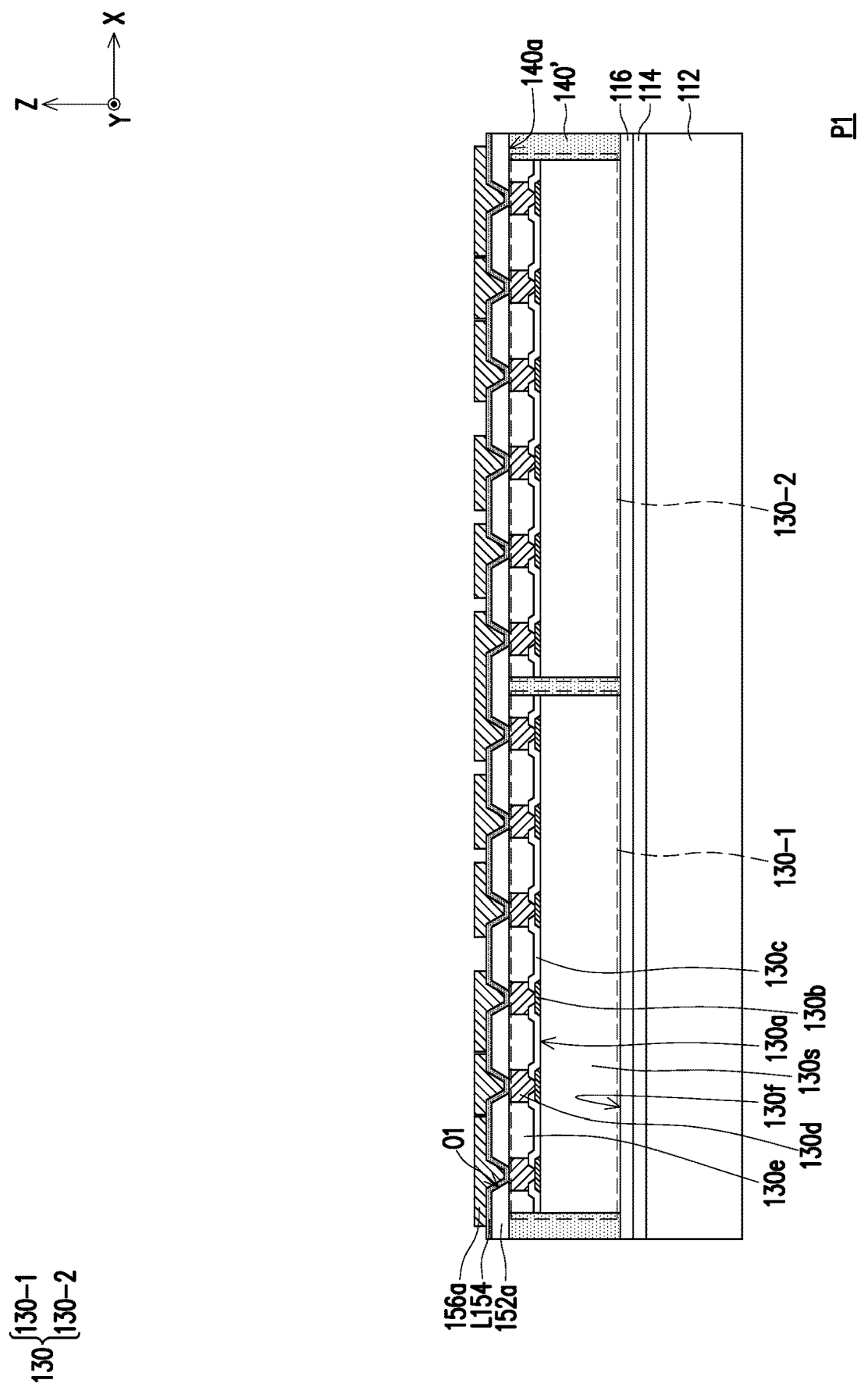

Referring to FIG. 6, in some embodiments, the patterned conductive layer 156a is formed and on the seed layer L154. In some embodiments, the patterned conductive layer 156a may be formed by, but not limited to, forming a patterned photoresist layer (not shown) on the seed layer L154, where the patterned photoresist layer has a plurality of recesses (not shown) exposing portions of the seed layer L154 (each overlapping with the underlying connection vias 130d); and filling a conductive material into the recesses formed in the patterned photoresistor layer to form the patterned conductive layer 156a. With such, the patterned conductive layer 156a may include a plurality of conductive patterns or segments. The patterned photoresist layer may be formed by coating and photolithography processes or the like, and the number of the recesses may correspond to the number of later-formed conductive structure(s) (such as the conductive patterns or segments included in the patterned conductive layer 156a). In some embodiments, a material of the patterned photoresist layer, for example, includes a positive resist material or a negative resist material, that is suitable for a patterning process such as a photolithography process with a mask or a mask-less photolithography process (for instance, an electron-beam (e-beam) writing or an ion-beam writing). However, the disclosure is not limited thereto. In some alternative embodiments, the patterned conductive layer 156a may be formed by, but not limited to, forming a blanket layer of conductive material over the structure depicted in FIG. 5 to completely cover the seed layer L154 and patterning the conductive material blanket layer to form the patterned conductive layer 156a. That is, the patterned conductive layer 156a include a plurality of conductive patterns or segments. As shown in FIG. 6, portions of the seed layer L154 are exposed by the patterned conductive layer 156a. In some embodiments, the patterned conductive layer 156a is electrically connected to the seed layer L154 through physical connection therebetween.

In one embodiment, the patterned conductive layer 156a may be made of conductive materials formed by electroplating or deposition, such as copper, copper alloy, aluminum, aluminum alloy, or combinations thereof, which may be patterned using a photolithography and etching process. In some embodiments, the patterned conductive layer 156a may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 7:
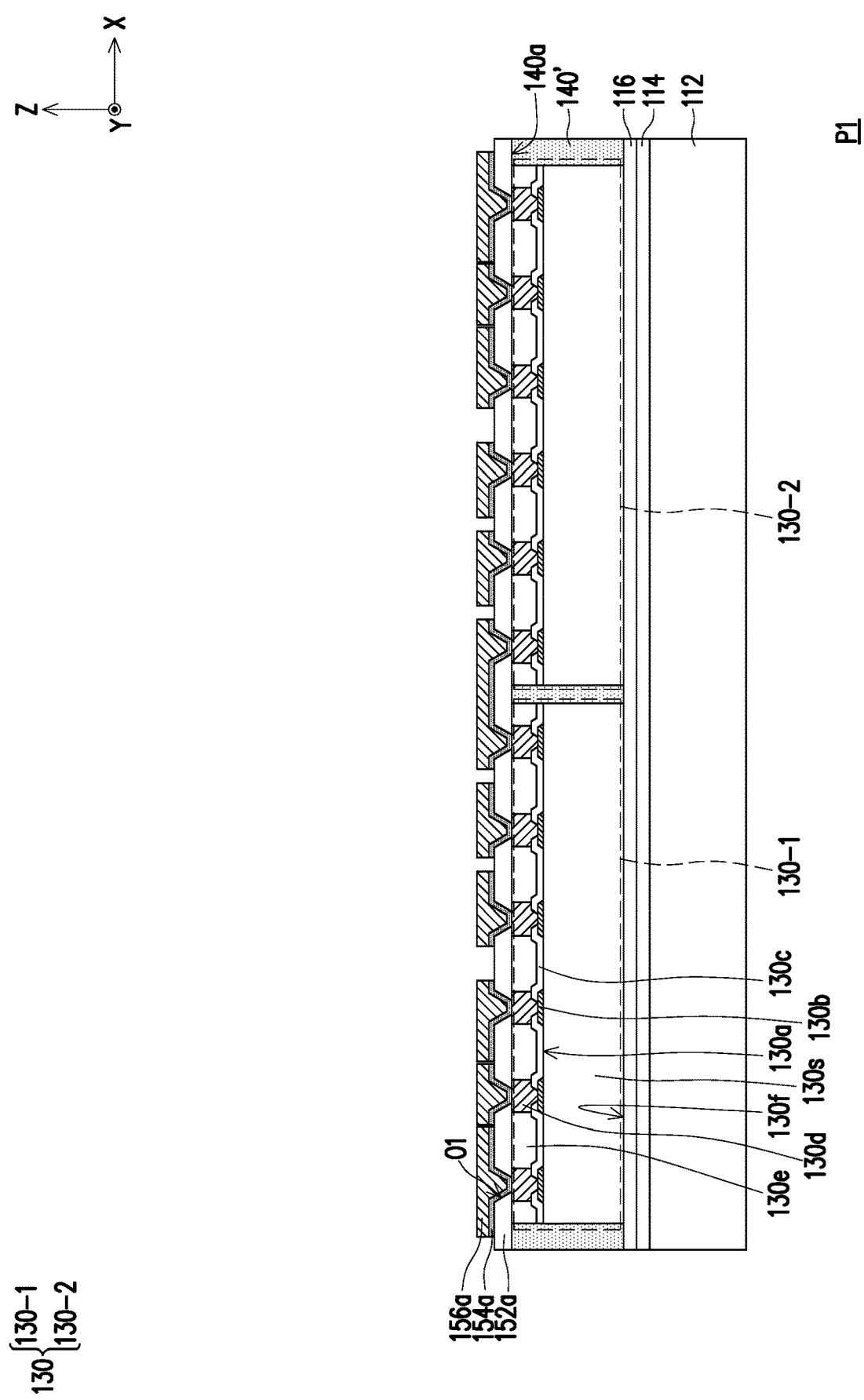

Referring to FIG. 7, in some embodiments, the seed layer L154 is patterned to form a seed layer 154a. In some embodiments, the seed layer L154 is patterned by using the patterned conductive layer 156a as an etching mask to remove the portion of the seed layer L154 exposed by the patterned conductive layer 156a to form the seed layer 154a. For example, the etching process may be a dry etching process, a wet etching process, or a combination thereof; the disclosure is not limited thereto. That is, the seed layer 154a includes a plurality of conductive patterns or segments, where one conductive patterns or segments of the seed layer 154b is physically and electrically connected to a respective one conductive patterns or segments of the patterned conductive layer 156a overlying thereto. In other words, for example, in a vertical projection (e.g. a vertical projection along the direction Z) on the insulating encapsulation 140', the patterned conductive layer 156a is completely overlapped with the seed layer 154a. In some embodiments, as shown in FIG. 7, the patterned conductive layer 156a is electrically connected to the semiconductor dies 130 through physically connecting the seed layer 154a and the conductive vias 130d.

Figure 8:
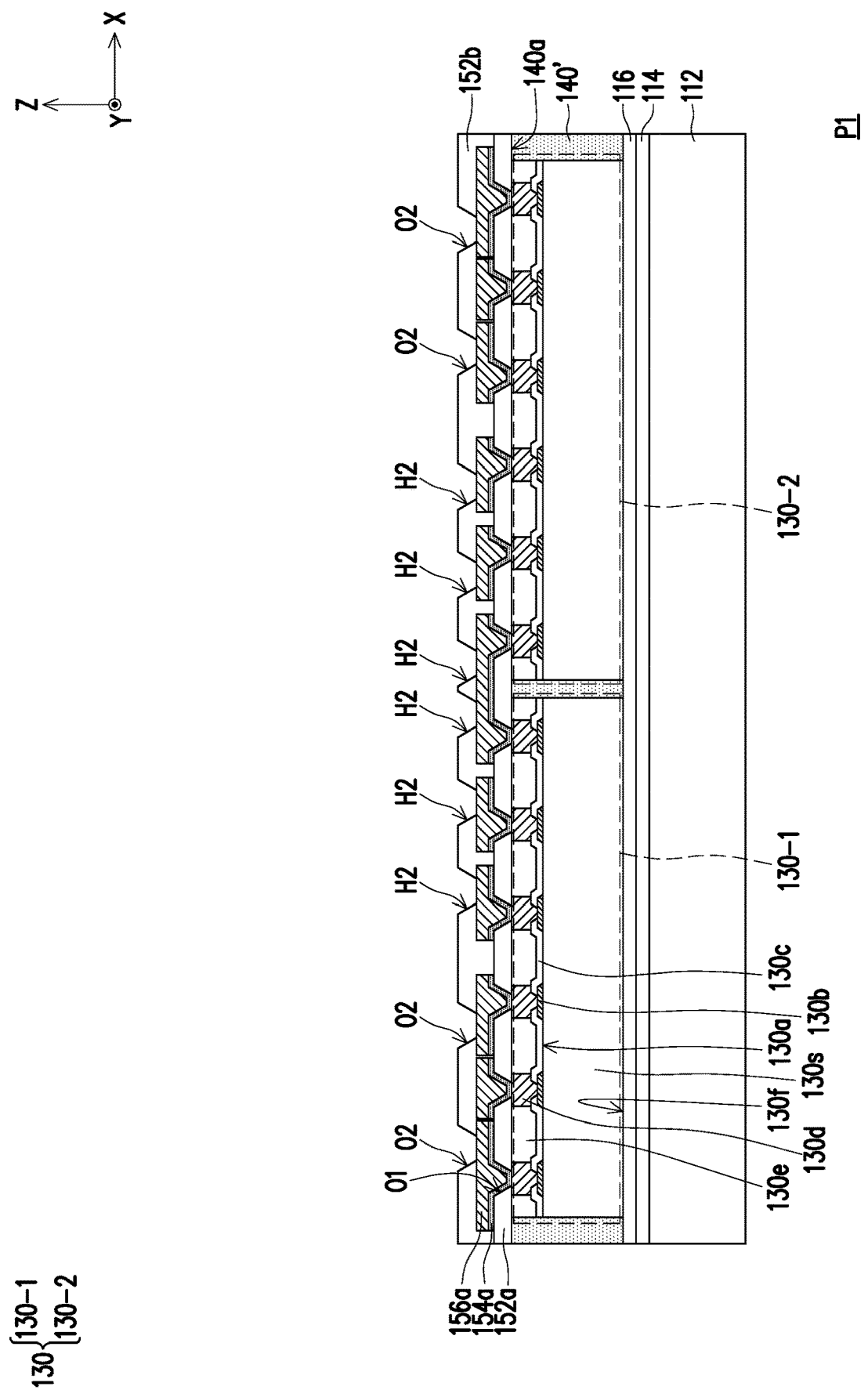

Referring to FIG. 8, in some embodiments, the dielectric layer 152b is formed on the patterned conductive layer 156a and over the carrier 112. In some embodiments, the dielectric layer 152b is formed by, but not limited to, forming a blanket layer of dielectric material over the structure depicted in FIG. 7 to completely cover the patterned conductive layer 156a, the seed layer 154a, and the dielectric layer 152a exposed by the patterned conductive layer 156a and the seed layer 154a, and patterning the dielectric material blanket layer to form the dielectric layer 152b. In one embodiment, the formation and material of the dielectric layer 152b may be the same as the formation and material of the dielectric layer 152a. In an alternative embodiment, the formation and material of the dielectric layer 152b may be different from the formation and material of the dielectric layer 152a. The disclosure is not limited thereto.

In some embodiments, during patterning the dielectric material blanket layer to form the dielectric layer 152b, openings O2 and holes H2 are formed in the dielectric material blanket layer to form the dielectric layer 152b. In other words, the openings O2 and the holes H2 penetrate through the dielectric layer 152b, and thus portions of the patterned conductive layer 156a are accessibly revealed by the dielectric layer 152b through the openings O2 and the holes H2. As shown in FIG. 8, for example, in the vertical projection on the insulating encapsulation 140' along the direction Z, positioning location of the holes H2 correspond to positioning locations of portions of the patterned conductive layer 156a, where the portions of the patterned conductive layer 156a are electrically connected to the semiconductor dies 130-1 and 130-2 through physical connection between the seed layer 154a immediately underlying thereto and the adjacent conductive vias 130d of the semiconductor dies 130-1 and 130-2.

Figure 9:
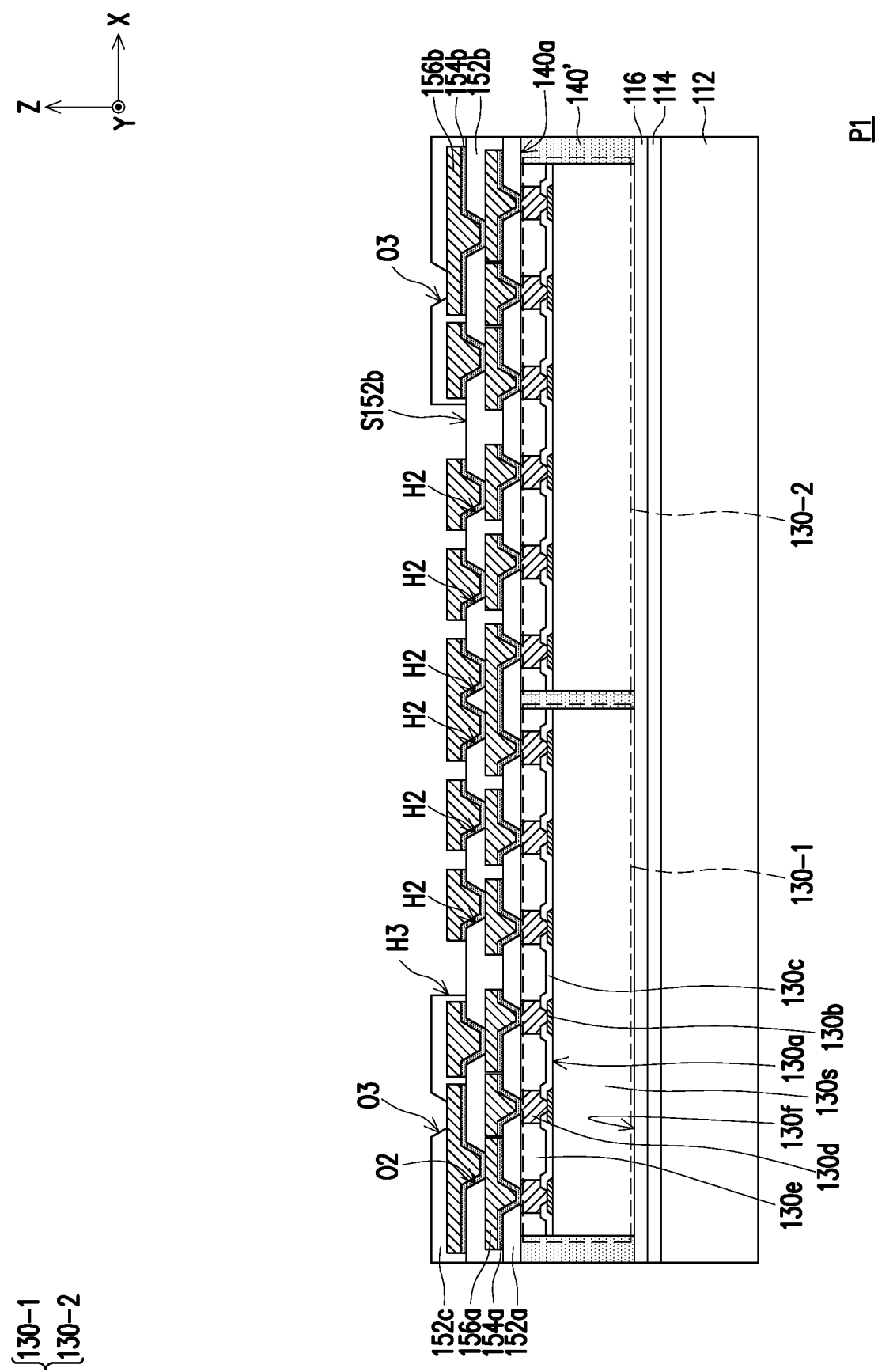

Referring to FIG. 9, in some embodiments, the seed layer 154b, the patterned conductive layer 156b, and the dielectric layer 152c are sequentially formed on the structure depicted on FIG. 8. The formation and material of the seed layer 154b are the same or similar to the process and material of forming the seed layer 154a described in FIG. 5 to FIG. 7, the formation and material of the patterned conductive layer 156b are the same or similar to the process and material of forming the patterned conductive layer 156a described in FIG. 6, and the formation and material of the dielectric layer 152c are the same or similar to the process and material of forming the dielectric layer 152b as described in FIG. 8, and thus are not repeated herein.

In some embodiments, the seed layer 154b is formed on the dielectric layer 152b and extends into the openings O2 and the holes H2 formed in the dielectric layer 152b to physically contact the patterned conductive layer 156a exposed by the openings O2 and the holes H2 in addition to portions of the dielectric layer 152b (e.g. sidewalls of the openings O2 and the holes H2). In other words, the seed layer 154b penetrates through the dielectric layer 152b, and the sidewalls and bottom surfaces of the openings O2 and the sidewalls and bottom surfaces of the holes H2 are completely covered by the seed layer 154b. In some embodiments, the patterned conductive layer 156b is formed on (e.g. in physical contact with) the seed layer 154b, where a projection area of the patterned conductive layer 156b is overlapped with a projection area of the seed layer 154b, in the vertical projection on the insulating encapsulation 140' along the direction Z. For example, as shown in FIG. 9, the patterned conductive layer 156b is electrically connected to the patterned conductive layer 156a through the seed layer 154b. In some embodiments, the seed layer 154b the patterned conductive layer 156b each include a plurality of conductive patterns or segments, where one conductive patterns or segments of the seed layer 154b is physically and electrically connected to a respective one conductive patterns or segments of the patterned conductive layer 156b overlying thereto.

In some embodiments, the dielectric layer 152c is formed on the patterned conductive layer 156b, the seed layer 154b, and the dielectric layer 152b exposed by the patterned conductive layer 156b and the seed layer 154b, where openings O3 and a trench H3 are formed in the dielectric layer 156c. As shown in FIG. 9, for example, the openings O3 and the trench H3 penetrate through the dielectric layer 152c, and thus portions of the patterned conductive layer 156b are accessibly revealed by the dielectric layer 152c through the openings O3 and the trench H3. In some embodiments, the openings O3 each respectively and at least partially exposes a respective one of the portions of the patterned conductive layer 156b while the trench H3 exposes more than one of the portions of the patterned conductive layer 156b. In some embodiments, a surface S152b of the dielectric layer 152b exposed by the exposed ones of the portions of the patterned conductive layer 156b exposed by the trench H3 is also accessibly revealed by the trench H3. As shown in FIG. 9, for example, in the vertical projection on the insulating encapsulation 140' along the direction Z, a positioning location of the trench H3 at least partially overlaps a positioning location of the semiconductor die 130-1 and a positioning location of the semiconductor die 130-2. In some embodiments, the positioning location of the trench H3 corresponds to and overlaps to the positioning locations of the holes H2.

Figure 10:
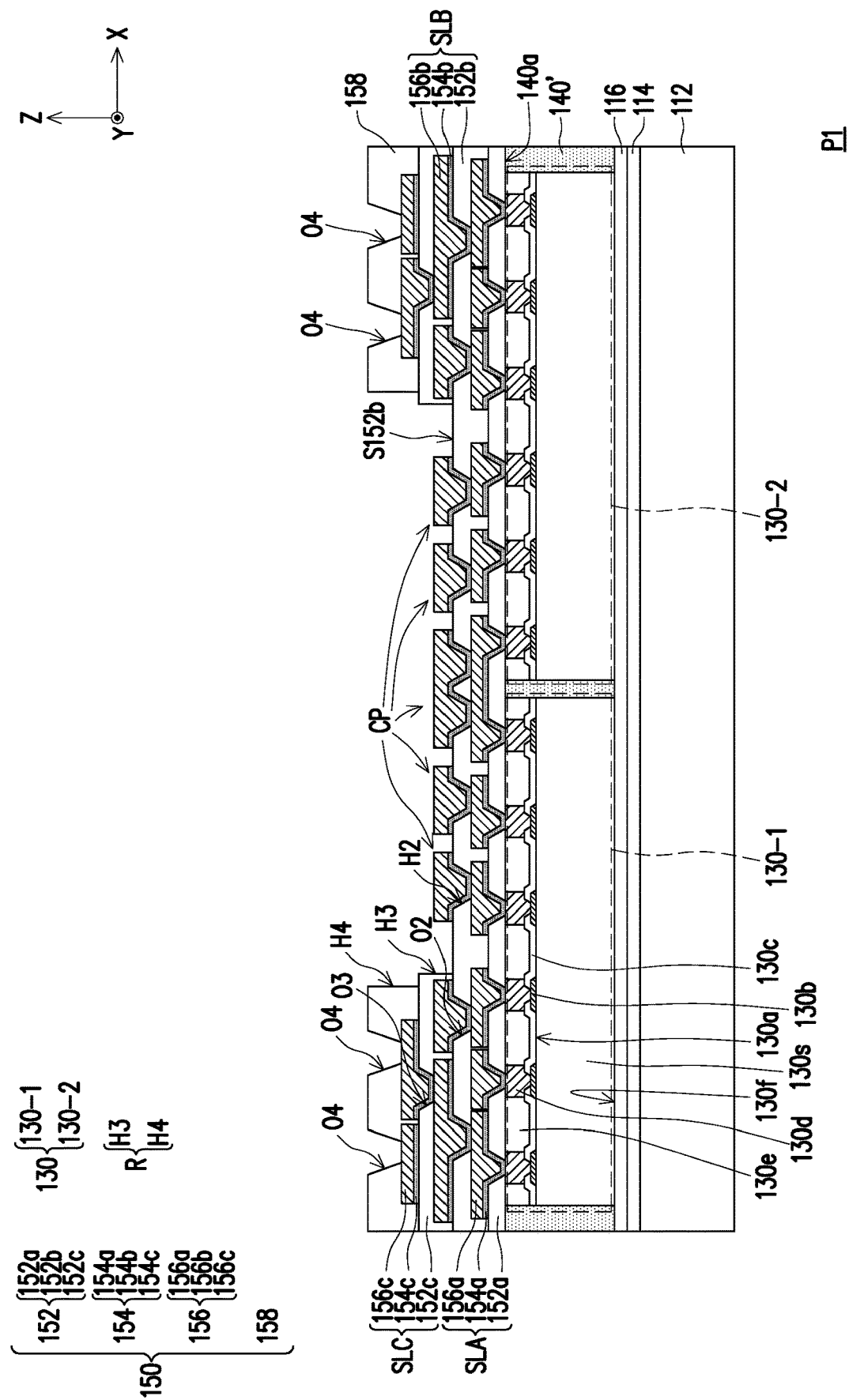

Referring to FIG. 10, in some embodiments, the seed layer 154c, the patterned conductive layer 156c, and the dielectric layer 158 are sequentially formed on the structure depicted on FIG. 9. The formation and material of the seed layer 154c are the same or similar to the process and material of forming the seed layer 154a as described in FIG. 5 to FIG. 7, the formation and material of the patterned conductive layer 156c are the same or similar to the process and material of forming the patterned conductive layer 156a as described in FIG. 6, and the formation and material of the dielectric layer 158 are the same or similar to the process and material of forming the dielectric layer 152b as described in FIG. 8, and thus are not repeated herein. In some embodiments, the seed layer 154c the patterned conductive layer 156c each include a plurality of conductive patterns or segments, where one conductive patterns or segments of the seed layer 154c is physically and electrically connected to a respective one conductive patterns or segments of the patterned conductive layer 156c overlying thereto.

In some embodiments, the seed layer 154c is formed on the dielectric layer 152c and extends into the openings O3 formed in the dielectric layer 152c to physically contact the patterned conductive layer 156b exposed by the openings O3 in addition to portions of the dielectric layer 152c (e.g. sidewalls of the openings O3). In other words, the seed layer 154c penetrates through the dielectric layer 152c through the openings O3, and the sidewalls and bottom surfaces of the openings O3 are completely covered by the seed layer 154c. In some embodiments, the patterned conductive layer 156c is formed on (e.g. in physical contact with) the seed layer 154c extending into the openings O3, where a projection area of the patterned conductive layer 156c is overlapped with a projection area of the seed layer 154c, in the vertical projection on the insulating encapsulation 140' along the direction Z. For example, as shown in FIG. 10, the patterned conductive layer 156c is electrically connected to the patterned conductive layer 156b through the seed layer 154c. In some embodiments, none of the seed layer 154c and the patterned conductive layer 156c is formed within the trench H3.

In some embodiments, the dielectric layer 158 is formed on the structure depicted in FIG. 9, where openings O4 and a trench H4 are formed in the dielectric layer 158. For example, the dielectric layer 158 is formed on the patterned conductive layer 156c, the seed layer 154c, the dielectric layer 152c exposed by the patterned conductive layer 156c and the seed layer 154c, where the openings O4 at least partially exposes the patterned conductive layer 156c and the trench H4 exposes the patterned conductive layer 156b, the seed layer 154b, and the dielectric layer 152b exposed by the patterned conductive layer 156b and the seed layer 154b within the trench H3 formed in the dielectric layer 152c. As shown in FIG. 10, for example, the openings O4 and the trench H4 penetrate through the dielectric layer 158, and thus portions of the patterned conductive layer 156c (formed over the openings O3) are accessibly revealed by the dielectric layer 158 through the openings O4, and the portions of the patterned conductive layer 156b (formed over the holes H2 within the openings O3) are accessibly revealed by the dielectric layer 158 through the trench H4. In some embodiments, the openings O4 each respectively and at least partially exposes a respective one of the portions of the patterned conductive layer 156c formed over the openings O3 while the trench H4 exposes the portions of the patterned conductive layer 156b over the holes H2 and exposed by the trench H3. In some embodiments, the surface S152b of the dielectric layer 152b exposed by the exposed ones of the portions of the patterned conductive layer 156b exposed by the trench H3 is further accessibly revealed by the trench H4.

As shown in FIG. 10, for example, in the vertical projection on the insulating encapsulation 140' along the direction Z, a positioning location of the trench H4 at least partially overlaps the positioning locations of the semiconductor die 130-1 and the semiconductor die 130-2 and completely overlaps the positioning location of the trench H3. In some embodiments, the positioning location of the trench H4 corresponds to the positioning locations of the holes H3, where the trench H4 is spatially communicated to the trench H3, and the trench H3 and the trenches H4 together constitute a recess R in the redistribution circuit structure 150. In other words, the recess R is formed in the dielectric layer 152c and the dielectric layer 158.

In some embodiments, the portions of the patterned conductive layer 156c exposed by the openings O4 formed in the dielectric layer 158 are for electrical connection to later-formed connectors or external component(s) or device(s). On the other hands, the portions of the patterned conductive layer 156b located in the trench H3 formed in the dielectric layer 152c exposed by the trench H4 formed in the dielectric layer 158 and the respective portions of the seed layer 154b are referred to as contact pads CP for electrical connection to later-formed connectors or external component(s) or device(s). Upon this, the redistribution circuit structure 150 of the package structure P1 is manufactured.

In the disclosure, the layers (e.g. the dielectric layer 152a, the seed layer 154a and the patterned conductive layer 156a) formed in FIG. 4 to FIG. 7, the layers (e.g. the dielectric layer 152b, the seed layer 154b and the patterned conductive layer 156b) formed in FIG. 8 to FIG. 9 and the layers (e.g. the dielectric layer 152c, the seed layer 154c and the patterned conductive layer 156c) formed in FIG. 9 to FIG. 10 may be respectively referred to as a first build-up layer SLA, a second build-up layer SLB and a third build-up layer SLC of the redistribution circuit structure 150 and are electrically connected to each other. That is, the first build-up layer SLA, the second build-up layer SLB and the third build-up layer SLC are together referred to as the redistribution circuit structure 150 for providing routing function in the package structure P1.

In addition, the dielectric layer 158 may be referred to as a passivation layer or a protection layer for providing protection to the redistribution circuit structure 150. It is appreciated that a width of the trench H4 formed in the dielectric layer 158 is greater than a width of the trench H3, as measured along a horizontal direction (e.g. the direction X or the direction Y) which being perpendicular to the direction Z. However, the disclosure is not limited thereto; in an alternative embodiment, along the horizontal direction, the width of the trench H4 formed in the dielectric layer 158 may be substantially equal to the width of the trench H3. In some embodiments, the recess R formed in the redistribution circuit structure 150, which is constituted by the trenches H3 and H4 respectively formed in the dielectric layers 152b and 152c, has a step-shaped sidewall, as FIG. 10. However, the disclosure is not limited thereto. In an alternative embodiment (not shown), the recess R formed in the redistribution circuit structure 150, which is constituted by the trenches H3 and H4 respectively formed in the dielectric layers 152b and 152c, has a flatten sidewall.

Referring to FIG. 4 to FIG. 10 together, in some embodiments, the redistribution circuit structure 150 is formed on the semiconductor dies 130 and the insulating encapsulation 140', where the redistribution circuit structure 150 is electrically connected to the semiconductor dies 130 (e.g. the semiconductor dies 130-1 and 130-2), respectively. For example, the redistribution circuit structure 150 is formed on the top surfaces of the semiconductor dies 130 (e.g. the top surfaces of the conductive vias 130d and the protection layer 130e of the semiconductor dies 130-1 and 130-2) and the top surface 140a of the insulating encapsulation 140'. In some embodiments, the redistribution circuit structure 150 is electrically connected to the semiconductor dies 130 through the conductive vias 130d and the pads 130b. In some embodiments, the redistribution circuit structure 150 is referred to as a front-side redistribution layer of the semiconductor dies 130 for providing routing function. In some embodiments, the semiconductor dies 130 are located between the redistribution circuit structure 150 and the buffer layer 116, and the insulating encapsulation 140' are located between the redistribution circuit structure 150 and the buffer layer 116, as shown in FIG. 10.

Figure 18:
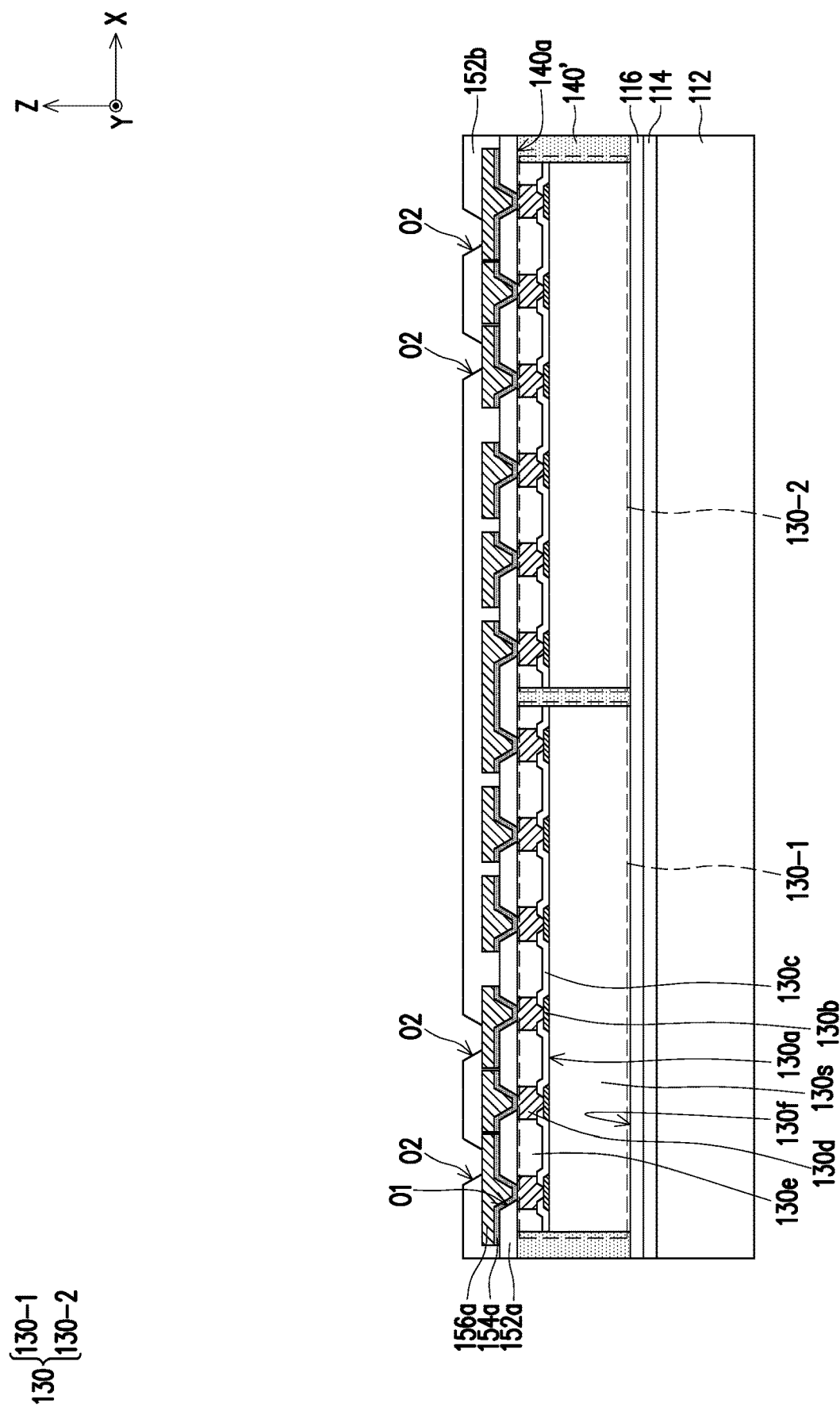
FIG. 18 to FIG. 20 are schematic cross-sectional views of various stages in a manufacturing method of a package structure in accordance with some embodiments of the disclosure.
Figure 19:
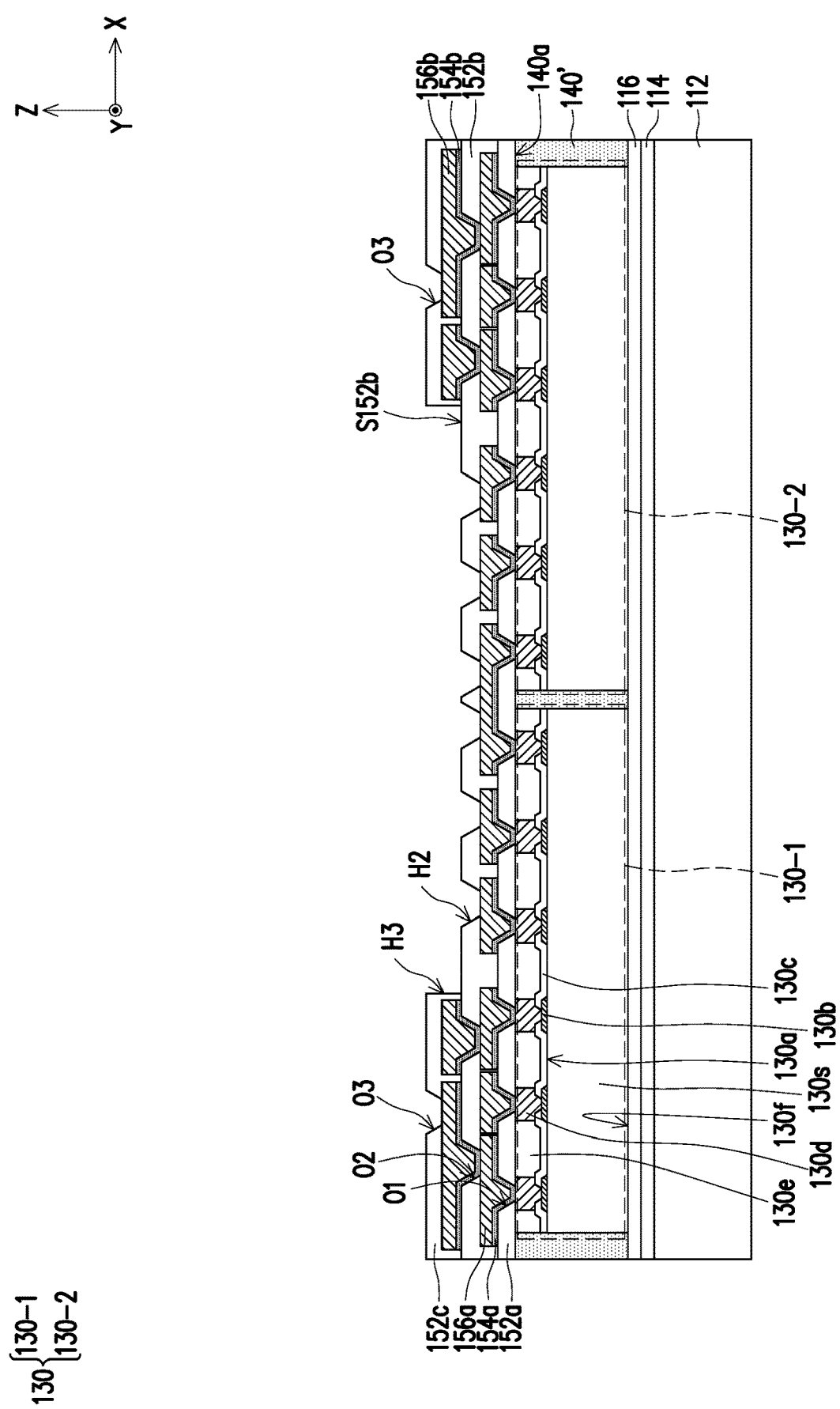
Figure 20:
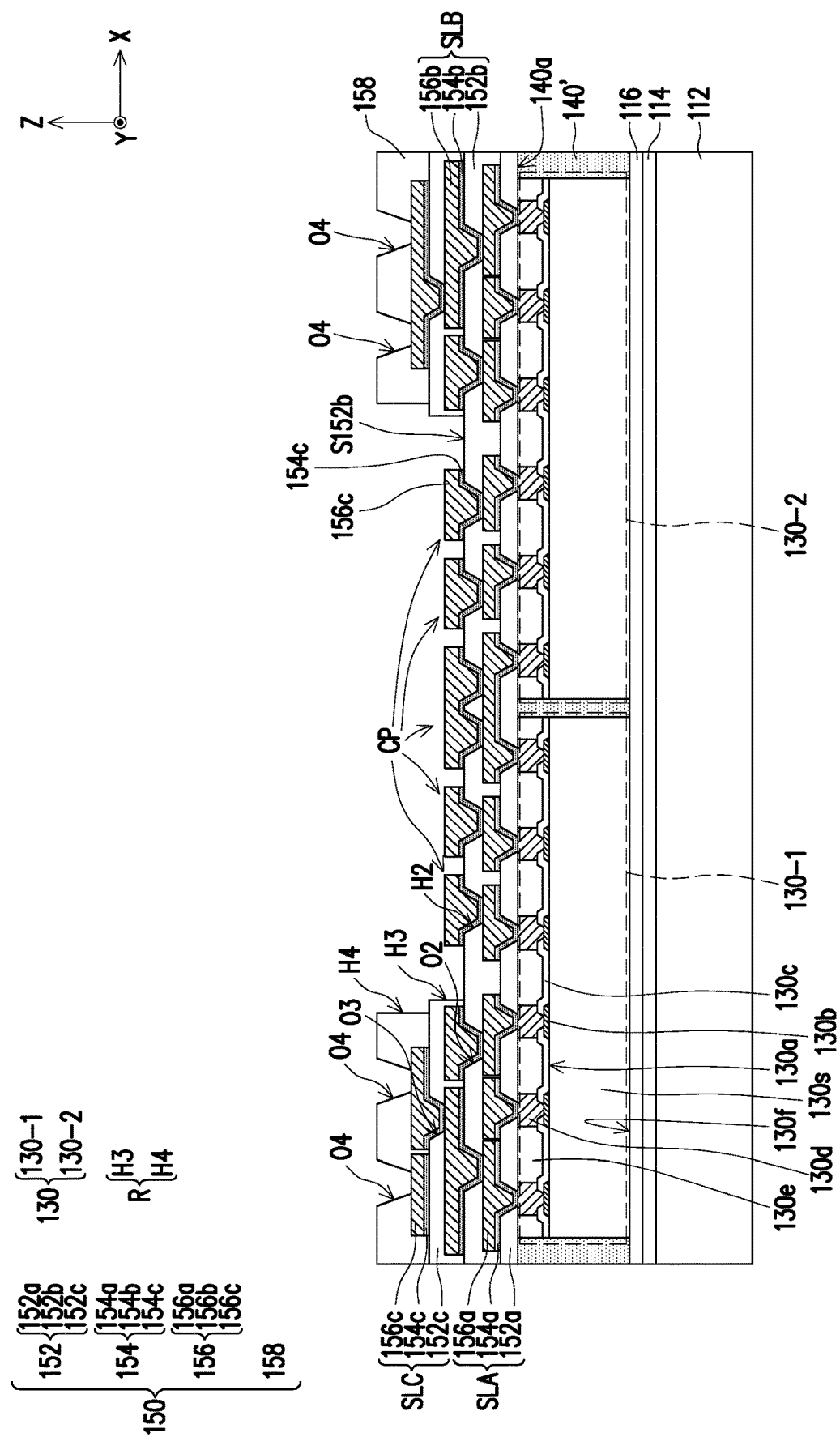

In an alternative embodiment, processes depicted in FIG. 18 to FIG. 20 may be used to replace the processes described in FIG. 8 to FIG. 10. After the formation of the seed layer 154a by using the patterned conductive layer 156a as the etching mask (FIG. 7), the dielectric layer 152b with the openings O2 is formed thereon, as shown in FIG. 18. As shown in FIG. 18, for example, no formation of the holes H2 during forming the openings O2. As shown in FIG. 19, the seed layer 154b, the patterned conductive layer 156b, and the dielectric layer 152c are sequentially formed, where the dielectric layer 152c is formed with the openings O3 and the trench H3 penetrating therethrough, and the holes H2 are formed in the dielectric layer 152b and exposed by the trench H3. As shown in FIG. 19, the seed layer 154b and the patterned conductive layer 156b are not located in the trenches H3 formed in the dielectric layer 152c. Then, as shown in FIG. 20, the seed layer 154c, the patterned conductive layer 156c, and the dielectric layer 158 are sequentially formed to form the redistribution circuit structure 150, where the dielectric layer 158 is formed with the openings O4 and the trench H4 penetrating therethrough, where the trench H3 and the trench H4 are spatially communicated to each other and form the recess R in the redistribution circuit structure 150. As shown in FIG. 20, some of the conductive patterns or segments of the seed layer 154c and some of the conductive patterns or segments of the patterned conductive layer 156c overlying thereto are formed in the recess R. In such embodiment, the portions of the patterned conductive layer 156c located in the trench H3 formed in the dielectric layer 152c exposed by the trench H4 formed in the dielectric layer 158 and the respective portions of the seed layer 154c are referred to as the contact pads CP for electrical connection to later-formed connectors or external component(s) or device(s).

Figure 11:
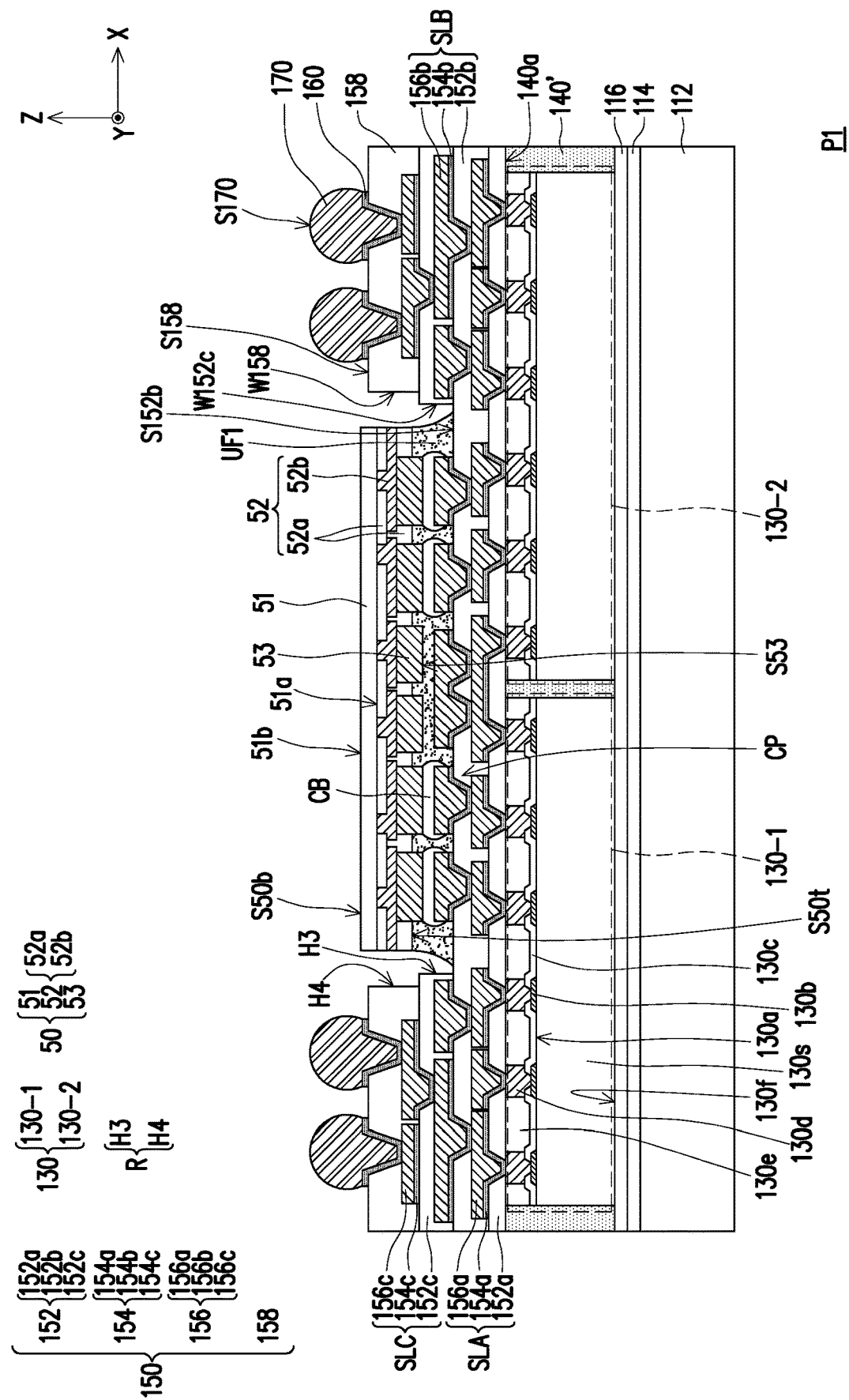

Referring to FIG. 11, in some embodiments, a plurality of under-ball metallurgy (UBM) patterns 160 and a plurality of conductive elements 170 are sequentially formed over the redistribution circuit structure 150. In some embodiments, as shown in FIG. 11, the UBM patterns 160 each are located between a respective one of the conductive elements 170 and the dielectric layer 158 of the redistribution circuit structure 150, where the UBM patterns 160 extend into the openings O4 formed in the dielectric layer 158 to physically contact the portions of the patterned conductive layer 156c exposed by the openings O4. Due to the UBM patterns 160, the adhesive strength between the conductive elements 170 and the redistribution circuit structure 150 is enhanced.

In some embodiments, the UBM patterns 160 are directly located on the portions of the patterned conductive layer 156c exposed by the openings O4 formed in the dielectric layer 158. As shown in FIG. 11, in some embodiments, the UBM patterns 160 are electrically connected to the redistribution circuit structure 150, and the conductive elements 170 are electrically connected to the redistribution circuit structure 150 through the UBM patterns 160. In some embodiments, the conductive elements 170 are electrically connected to the semiconductor dies 130 through the redistribution circuit structure 150 and the UBM patterns 160. For example, some of the conductive elements 170 are electrically connected to the semiconductor die 130-1 through the redistribution circuit structure 150 and respective ones of the UBM patterns 160. For example, some of the conductive elements 170 are electrically connected to the semiconductor die 130-2 through the redistribution circuit structure 150 and respective ones of the UBM patterns 160.

In some embodiments, the materials of the UBM patterns 160 may include copper, nickel, titanium, tungsten, or alloys thereof or the like, and may be formed by an electroplating process, for example. The number of the UBM patterns 160 is not limited in this disclosure, and corresponds to the number of the portions of the patterned conductive layer 156c exposed by the openings O4 formed in the dielectric layers 158.

In some embodiments, the conductive elements 170 may be disposed on the UBM patterns 160 by ball placement process or reflow process. In some embodiments, the conductive elements 170 are, for example, solder balls or ball grid array (BGA) balls. The number of the conductive elements 170 is not limited to the disclosure, and may be designated and selected based on the number of the UBM patterns 160.

However, the disclosure is not limited thereto. In some alternative embodiments (not shown), the UBM patterns 160 may be omitted. For example, the conductive elements 170 may directly connected to the redistribution circuit structure 150 (e.g. the portions of the patterned conductive layer 156c exposed by the openings O4). In some further alternative embodiments, the conductive elements 170 are conductive pillars electrically connected to the redistribution circuit structure 150 through the UBM patterns 160, see FIG. 24 to FIG. 26 (details thereof will be described later in conjunction with figures).

Continued on FIG. 11, in some embodiments, at least one semiconductor device 50 is provided and disposed in the recess R formed in the redistribution circuit structure 150. In some embodiments, the semiconductor device 50 is bonded on and electrically connected to the redistribution circuit structure 150 through the contact pads CP, where the contact pads CP each includes one of the conductive patterns or segments included in the seed layer 154b and a respective one of the conductive patterns or segments included in the patterned conductive layer 156b overlying and electrically connected thereto. As shown in FIG. 11, the semiconductor device 50 is bonded on the redistribution circuit structure 150 by physically connecting the conductive vias 53 of the semiconductor device 50 to the contact pads CP of the redistribution circuit structure 150 through connectors CB. In some embodiments, the connectors CB may be conductive balls or bumps, such as tin solder bumps or the like, the disclosure is not limited thereto.

As shown in FIG. 11, the semiconductor device 50 is electrically connected to the semiconductor dies 130, for example. In some embodiments, the semiconductor device 50 is electrically communicated to the semiconductor die 130-1 and the semiconductor die 130-2, simultaneously, and the semiconductor die 130-1 and the semiconductor die 130-2 are electrically communicated to each other through the semiconductor device 50. In some alternative embodiments, the semiconductor device 50 is electrically communicated to the semiconductor die 130-1 and the semiconductor die 130-2, simultaneously, and the semiconductor die 130-1 and the semiconductor die 130-2 are electrically communicated to each other through the first build-up layer SLA of the redistribution circuit structure 150. In further alternative embodiments, the semiconductor device 50 is electrically communicated to the semiconductor die 130-1 and the semiconductor die 130-2, simultaneously, and the semiconductor die 130-1 and the semiconductor die 130-2 are electrically communicated to each other through the first build-up layer SLA of the redistribution circuit structure 150 and the semiconductor device 50.

In some embodiments, the semiconductor device 50 includes a semiconductor substrate 51 having an active surface 51a and a backside surface 51b opposite to the active surface 51a, an interconnection structure 52 disposed on the active surface 51a, and a plurality of conductive vias 53 connecting to the interconnection structure 52. The interconnection structure 52 and the conductive vias 53 are formed on the semiconductor substrate 51. As shown in FIG. 11, the interconnection structure 52 is sandwiched between the semiconductor substrate 51 and the conductive vias 53.

In some embodiments, the semiconductor substrate 51 may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 51 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In some embodiments, the interconnection structure 52 may include one or more inter-dielectric layers 52a and one or more patterned conductive layers 52b stacked alternately for providing routing function to the active components and the passive components embedded in the semiconductor substrate 51. In one embodiment, the interconnection structure 52 may be formed in a back-end-of-line (BEOL) process. For example, the inter-dielectric layers 52a may be silicon oxide layers, silicon nitride layers, silicon oxy-nitride layers, or dielectric layers formed by other suitable dielectric materials, and the inter-dielectric layers 52a may be formed by deposition or the like. For example, the patterned conductive layers 52b may be patterned copper layers or other suitable patterned metal layers, and the patterned conductive layers 52b may be formed by electroplating or deposition. However, the disclosure is not limited thereto.

In some embodiments, the conductive vias 53 are disposed on the interconnection structure 52 and extend into the interconnection structure 52 to physically connected to a topmost layer of the patterned conductive layers 52b. That is, the conductive vias 53 are electrically connected to (the active components and the passive components embedded in) the semiconductor substrate 51. The conductive vias 53 are copper pillars, copper alloy pillar or other suitable metal pillars containing copper metal, for example. The number of the conductive vias 53 may be one or more than one, and is not limited to what is depicted in FIG. 11. The conductive vias 53 are referred to as conductive terminals of the semiconductor device 50 for electrical connection to external components.

In one embodiment, the semiconductor device 50 described herein may be a semiconductor chip or an IC, such as a digital chip, an analog chip or a mixed signal chip, such as an ASIC chip, a sensor chip, a wireless and RF chip, a memory chip, a logic chip or a voltage regulator chip. In an alternative embodiment, the semiconductor device 50 may be as a chip or an IC of combination-type, such as a WiFi chip simultaneously including both of a RF chip and a digital chip. In a further alternative embodiment, the semiconductor device 50 may be a SMD or an IPD that includes a passive device such as a resistor, an inductor, a capacitor, a jumper, a combination of these, or the like. In a further alternative embodiment, the semiconductor device 50 may be a bridge element providing an electrical connection between two or more than two semiconductor dies/chips/devices, or the like.

As illustrated in FIG. 11, for example, the semiconductor device 50 is located in the recess R formed in the redistribution circuit structure 150 and bonded on the redistribution circuit structure 150 through connecting the conductive vias 53 and the contact pads CP. In some embodiments, the semiconductor device 50 has a top surface S50t and a bottom surface S50b opposite to the top surface S50t along the direction Z, where the top surface S50t is closer to top surfaces S53 of the conductive vias 53 exposed from the interconnection structure 52 than the bottom surface S50b is. Sometimes, for example, the bottom surface S50b of the semiconductor device 50 is referred to the backside surface 51b of the semiconductor substrate 51. In some embodiments, the top surface S50t of the semiconductor device 50 is located inside the recess R formed in the redistribution circuit structure 150. That is, for example, in a cross-sectional view of FIG. 11, along the direction, the top surface S50t of the semiconductor device 50 is located between the outermost surface S158 of the dielectric layer 158 and the surface S152b of the dielectric layer 152b exposed by the trench H3 formed in the dielectric layer 152c.

On the other hand, for example, the bottom surface S50b of the semiconductor device 50 is located between end surfaces S170 (being most away from the surface S152b along the direction Z) of the conductive elements 170 and the surface S152b of the dielectric layer 152b exposed by the trench H3 formed in the dielectric layer 152c. That is, the bottom surface S50b of the semiconductor device 50 may be located outside of the recess R or inside of the recess R. In some embodiments of which the bottom surface S50b is located inside of the recess R, the bottom surface S50b may be at a location below or substantially the same as the location where the outermost surface S158 of the dielectric layer 158 is at and above the location where the surface S152b of the dielectric layer 152b is at along the direction Z. In some embodiments of which the bottom surface S50b is located outside of the recess R, the bottom surface S50b is at a location below or substantially the same as the location where the end surfaces S170 of the conductive elements 170 are at and above the location where the outermost surface S158 of the dielectric layer 158 is at along the direction Z, as shown in FIG. 11. As shown in FIG. 11, the top surface S50t of the semiconductor device 50 is located within the recess R and between the bottom surface S50b of the semiconductor device 50 and the surface S152b of the dielectric layer 152b exposed by the trench H3, and the bottom surface S50b of the semiconductor device 50 is located outside the recess R and between the end surfaces S170 of the conductive elements 170 and the top surface S50t of the semiconductor device 50. Due to such configuration, a shorter electrical connection paths between the semiconductor dies 130 and between the semiconductor dies 130 and the semiconductor device 50 are ensured, and the heat dissipation of the semiconductor device 50 is enhanced, thereby improving the performance and reliability of the package structure P1.

Continued on FIG. 11, in some embodiments, a underfill UF1 is formed in the recess R formed in the redistribution circuit structure 150. For example, the underfill UF1 at least fills the gaps between the top surface S50t of the semiconductor device 50 and the surface S152b of the dielectric layer 152b exposed by the trench H3, and wraps sidewalls of the conductive vias 53, the contact pads CP, and the connectors CB sandwiched between the conductive vias 53 and the contact pads. That is, in the package structure P1 shown in FIG. 11, the underfill UF1 covers a bottom surface (e.g. the surface S152b of the dielectric layer 152b exposed by the trench H3) of the recess R and is free from a sidewall (e.g. a sidewall W152c of the dielectric layer 152c exposed by the trench H3 and a sidewall W158 of the dielectric layer 158 exposed by the trench H4) of the recess R. In certain embodiments (not shown), a sidewall of the semiconductor device 50 may further covered by the underfill UF1, the disclosure is not limited thereto. The underfill UF1 may be any acceptable material, such as a polymer, epoxy-based resin, molding underfill, or the like, for example. In one embodiment, the underfill UF1 may be formed by underfill dispensing or any other suitable method. Owing to the underfill UF1, the bonding strength between the semiconductor device 50 and the redistribution circuit structure 150 is enhanced, thereby improving the reliability of the package structure P1.

However, the disclosure is not limited thereto. In an alternative embodiment, in addition to the bottom surface of the recess R, the underfill UF1 may further cover the sidewall (e.g. the sidewall W152c of the dielectric layer 152c exposed by the trench H3 and the sidewall W158 of the dielectric layer 158 exposed by the trench H4) of the recess R formed in the redistribution circuit structure 150, as shown in a package structure P1" depicted in FIG. 28.

Figure 12:
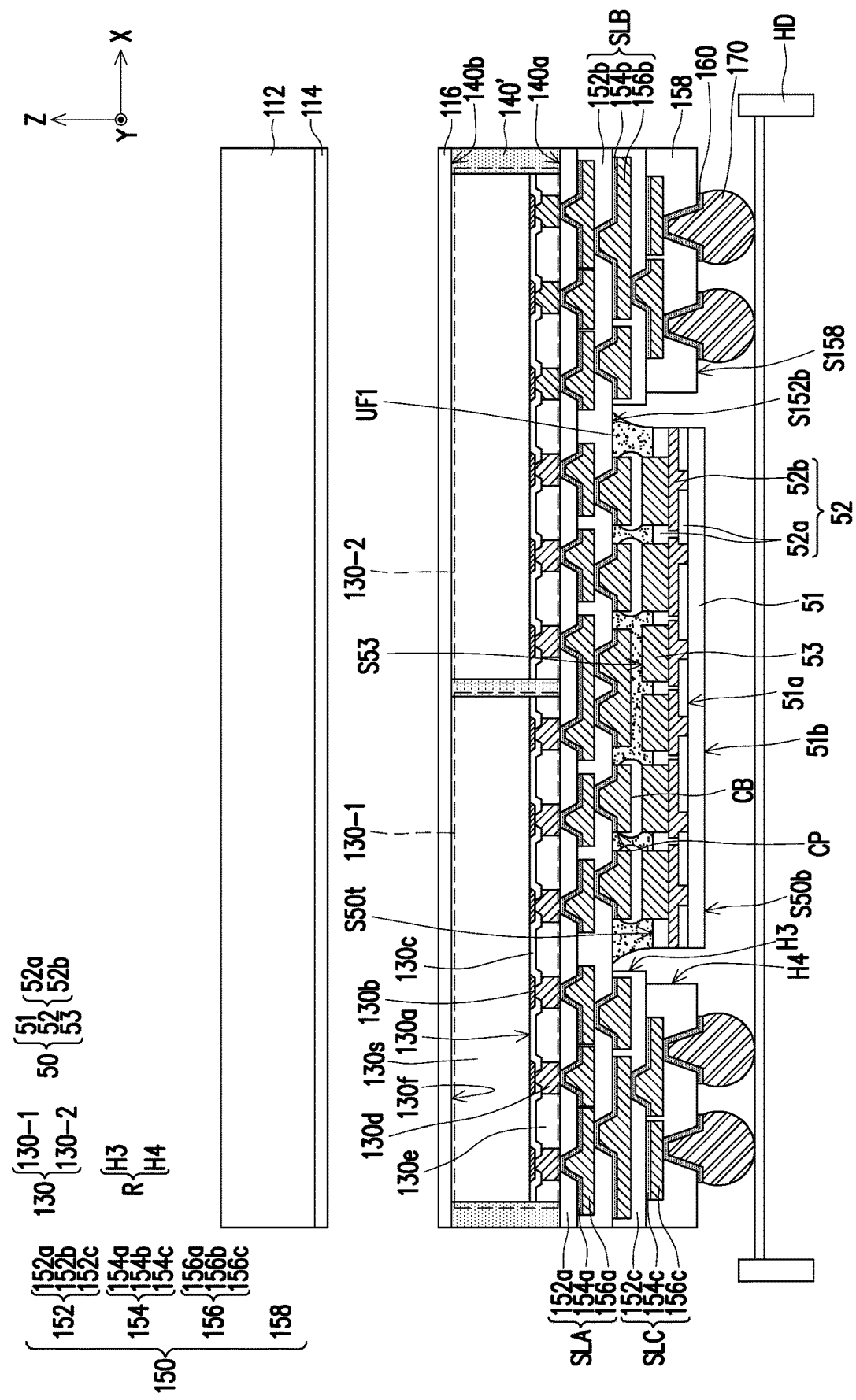

Referring to FIG. 12, in some embodiments, the whole structure depicted in FIG. 11 along with the carrier 112 is flipped (turned upside down), where the conductive elements 170 are placed to a holding device HD, and the carrier 112 is then debonded from the buffer layer 116. In some embodiments, the holding device HD may be an adhesive tape, a carrier film or a suction pad. The disclosure is not limited thereto.

In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 12. In one embodiment, the debonding process is a laser debonding process. During the debonding step, the holding device HD is used to secure the package structure P1 before debonding the carrier 112 and the debond layer 114.

However, the disclosure is not limited thereto. In an alternative embodiment (not shown), the buffer layer 116 may be further removed from the insulating encapsulation 140' and the semiconductor dies 130. In such embodiment of which the buffer layer 116 is further removed, the backside surface 130f of each of the semiconductor dies 130 is exposed from a bottom surface 140b of the insulating encapsulation 140', where the bottom surface 140b is opposite to the top surface 140a along the direction Z.

Figure 13:
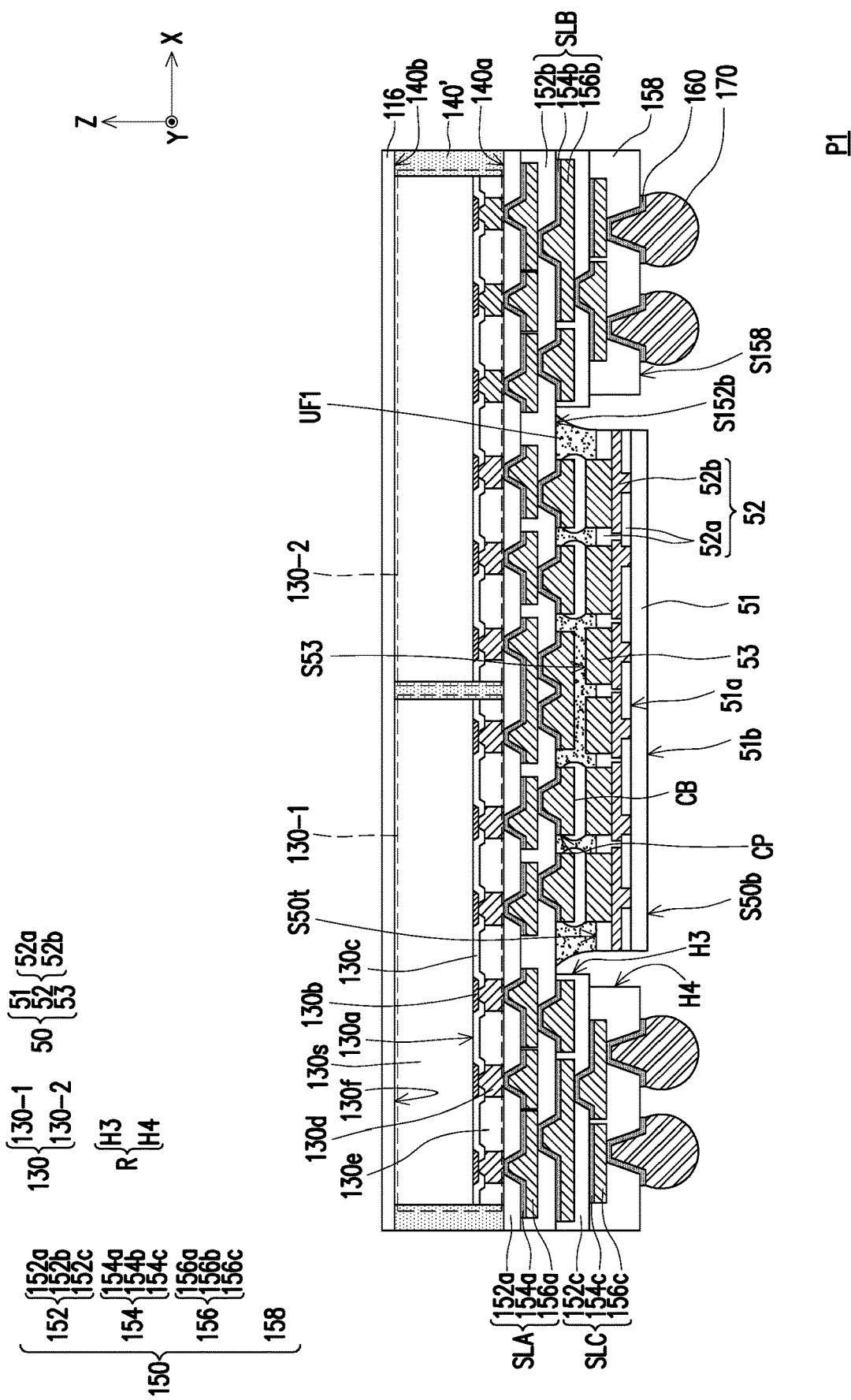

Referring to FIG. 12 and FIG. 13 together, in some embodiments, the conductive elements 170 are released from the holding device HD to form the package structure P1. In some embodiments, prior to releasing the conductive elements 170 from the holding device HD, a dicing (singulation) process is performed to cut a plurality of the package structure P1 interconnected therebetween into individual and separated package structure P1. In one embodiment, the dicing (singulation) process is a wafer dicing process including mechanical blade sawing or laser cutting. The disclosure is not limited thereto. Up to here, the manufacture of the package structure P1 is completed.

Figure 14:
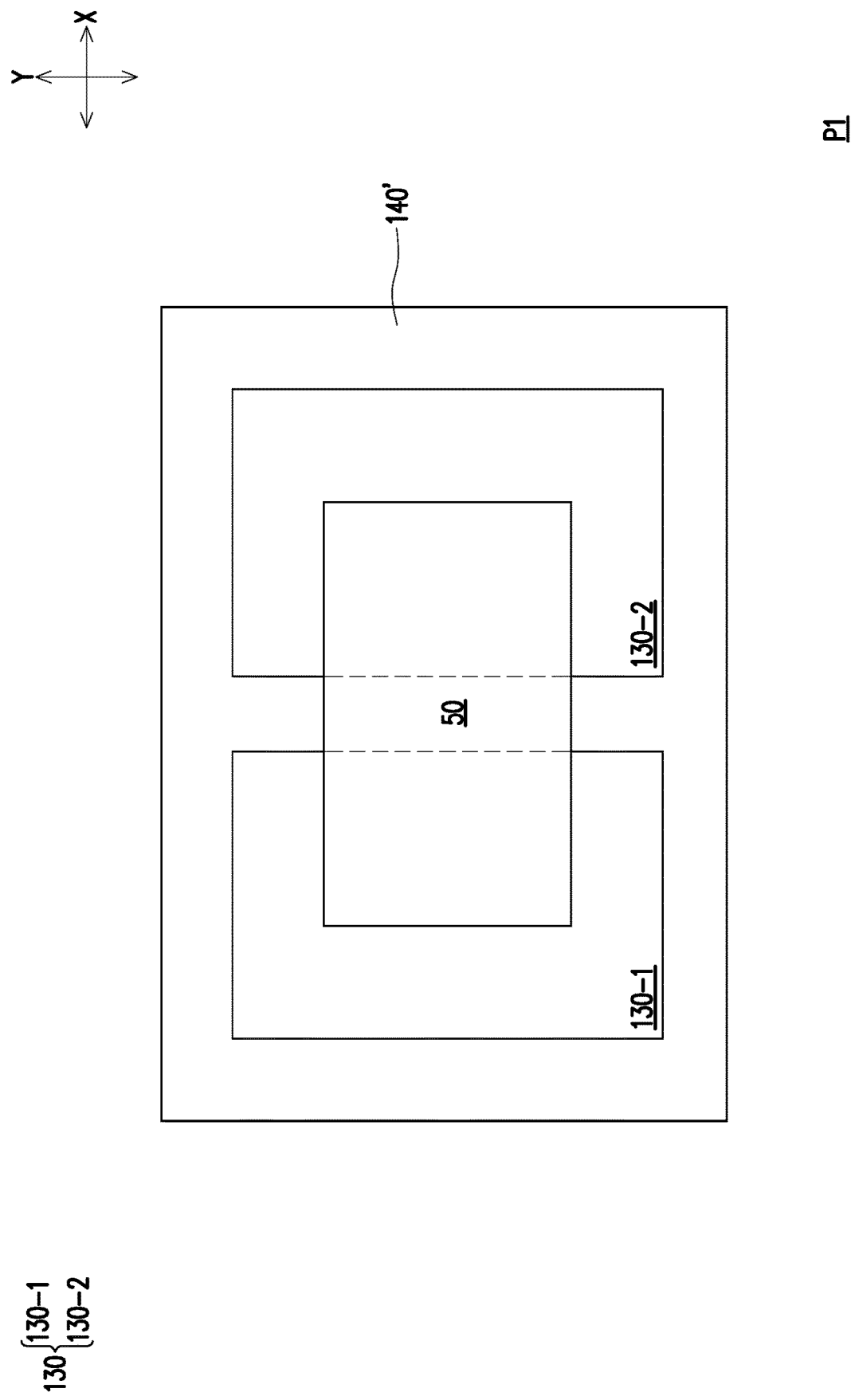
FIG. 14 to FIG. 17 are schematic top views respectively illustrating a relative position between semiconductor dies of a package structure according to some embodiments of the disclosure.

Referring to FIG. 13 and FIG. 14 (a top view of the package structure P1 depicted in FIG. 14 only showing the insulating encapsulation 140', the semiconductor dies 130 and the semiconductor device 50), in some embodiments, two semiconductor dies 130 and one semiconductor device 50 are shown, where the two semiconductor dies 130 include the semiconductor die 130-1 and the semiconductor die 130-2 laterally encapsulated by the insulating encapsulation 140', the semiconductor device 50 is electrically connected to the semiconductor dies 130-1 to 130-2, and the semiconductor device 50 is at least partially overlapped with each of the semiconductor dies 130-1 to 130-2 on the X-Y plane. However, the disclosure is not limited thereto. In such embodiments, the number of the recess R in the redistribution circuit structure 150 is one, where the semiconductor device 50 is placed into the recess R, as shown in FIG. 13.

It is appreciated that the number of the semiconductor die 130 may be two or more than two while the number of the semiconductor device 50 may be one or more than, the disclosure is not limited thereto. In certain embodiments, the number of the recess R formed inside the redistribution circuit structure 150 may be one or more than one. In some embodiments, there may be one or more than one semiconductor device 50 disposed inside one recess R.

Figure 15:
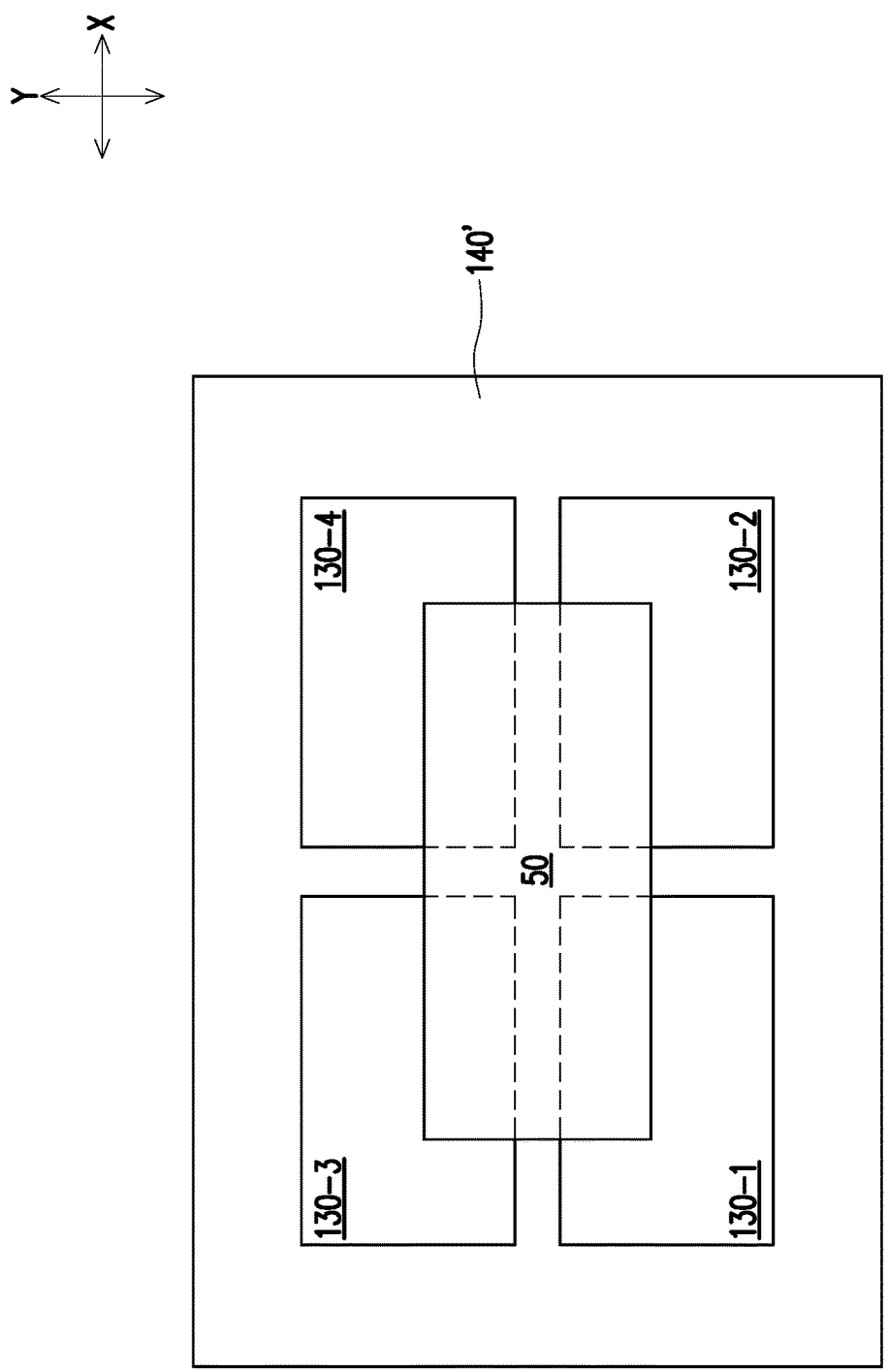

In one embodiment, as shown in FIG. 15, the semiconductor die 130 may include a plurality of semiconductor dies 130-1, 130-2, 130-3 and 130-4 laterally encapsulated by the insulating encapsulation 140', the semiconductor device 50 is electrically connected to the semiconductor dies 130-1 to 130-4. For example, in such embodiment shown in FIG. 15, the semiconductor device 50 is at least partially overlapped with each of the semiconductor dies 130-1 to 130-4 on the X-Y plane. Due to the presence of the semiconductor device 50, the semiconductor dies 130-1 to 130-4 may be electrically connected and communicated to each other. In one embodiment, the number of the recess R in the redistribution circuit structure 150 is one, where the semiconductor device 50 is placed into the recess R.

Figure 16:
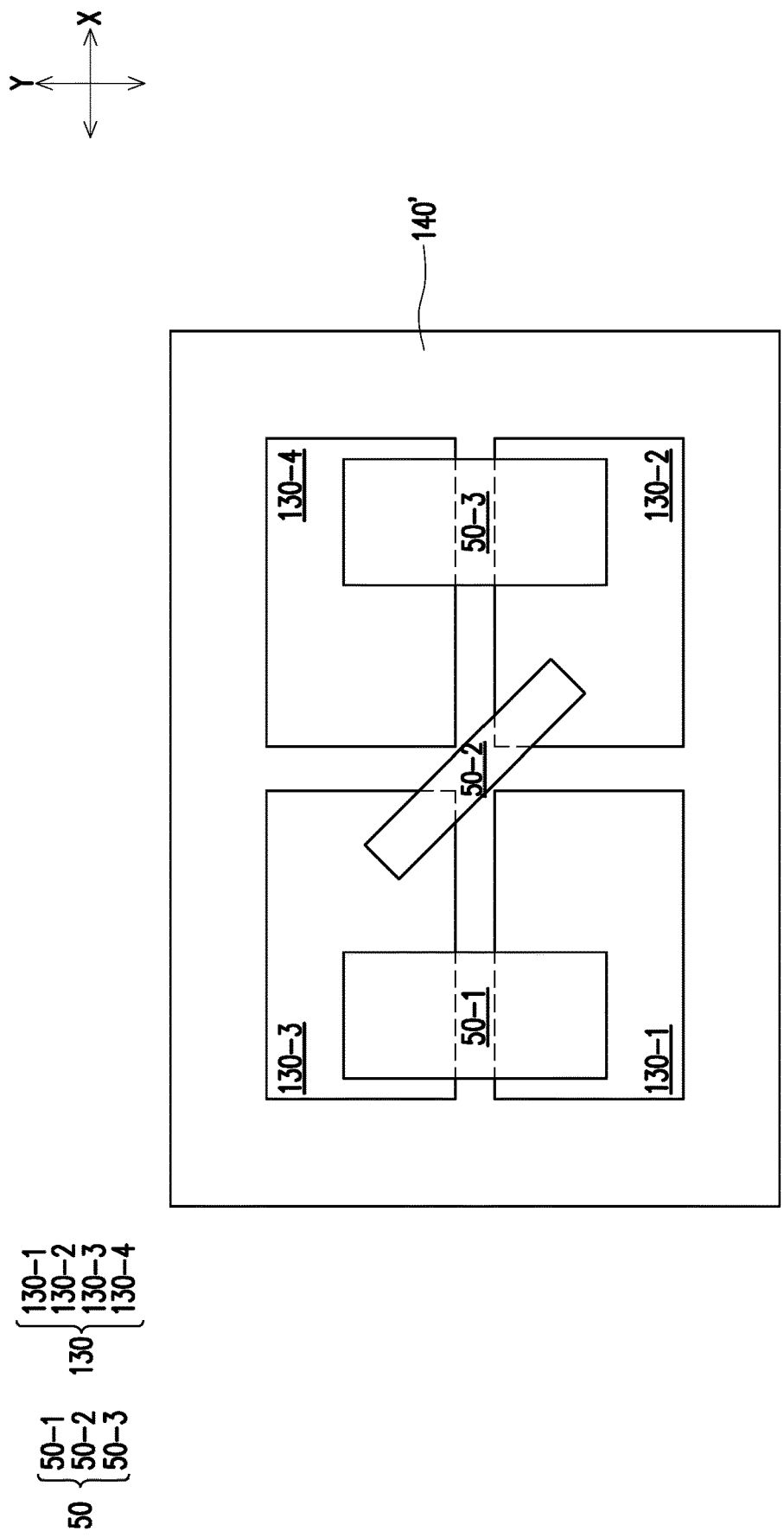

In an alternative embodiment, as shown in FIG. 16, the semiconductor die 130 may include a plurality of semiconductor dies 130-1, 130-2, 130-3 and 130-4 laterally encapsulated by the insulating encapsulation 140', the semiconductor device 50 may include a plurality of semiconductor devices 50-1, 50-2 and 50-3. For example, in such embodiment shown in FIG. 16, the semiconductor device 50-1 is electrically connected to the semiconductor dies 130-1 and 130-3 and at least partially overlapped with each of the semiconductor dies 130-1 and 130-3 on the X-Y plane, the semiconductor device 50-2 is electrically connected to the semiconductor dies 130-2 and 130-3 and at least partially overlapped with each of the semiconductor dies 130-2 and 130-3 on the X-Y plane, and the semiconductor device 50-3 is electrically connected to the semiconductor dies 130-2 and 130-4 and at least partially overlapped with each of the semiconductor dies 130-2 and 130-4 on the X-Y plane. In certain embodiments, the semiconductor device 50-2 may be further partially overlapped with each of the semiconductor dies 130-1 and 130-4 on the X-Y plane. Due to the presence of the semiconductor devices 50-1 to 50-3, the semiconductor dies 130-1 to 130-4 may be electrically connected and communicated to each other. In one embodiment, the number of the recess R in the redistribution circuit structure 150 may be one, where all of the semiconductor devices 50-1 to 50-3 are placed into the one same recess R. In an alternative embodiment, the number of the recess R in the redistribution circuit structure 150 may be three, where each of the semiconductor devices 50-1 to 50-3 is placed into a respective one recess of the three separate recesses R. In a further alternative embodiment, the number of the recess R in the redistribution circuit structure 150 may be two, where one of the semiconductor devices 50-1 to 50-3 is placed into a respective one recess of the two separate recesses R, and other two of the semiconductor devices 50-1 to 50-3 is placed into other one recess of the two separate recesses R.

Figure 17:
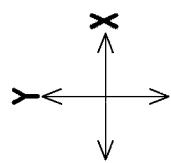
Figure 17:
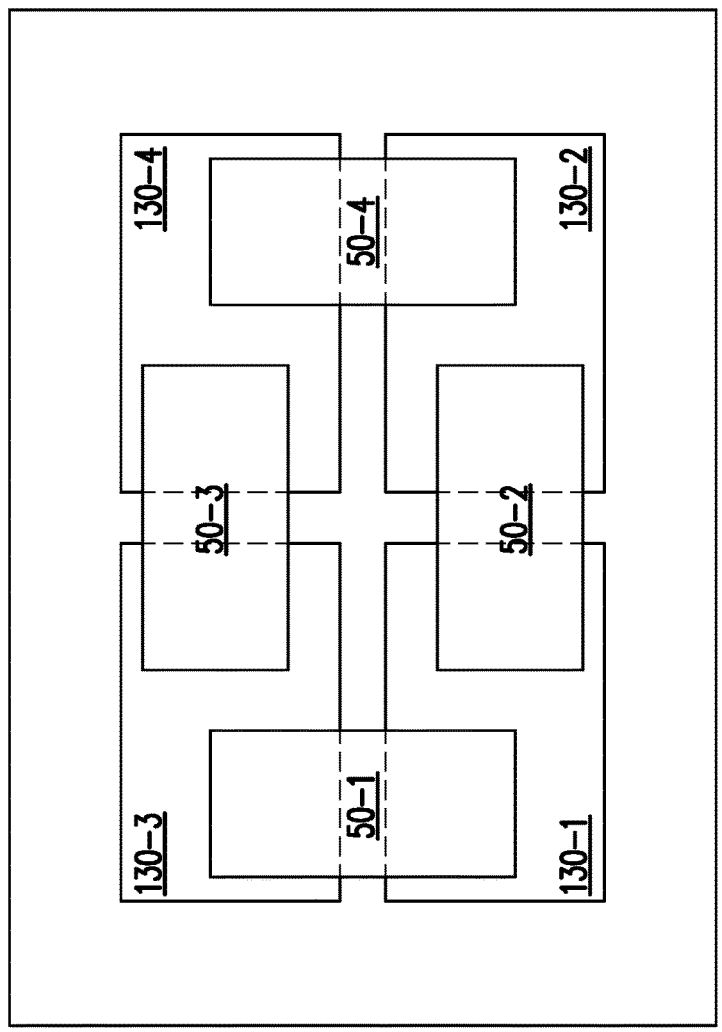

In an alternative embodiment, as shown in FIG. 17, the semiconductor die 130 may include a plurality of semiconductor dies 130-1, 130-2, 130-3 and 130-4 laterally encapsulated by the insulating encapsulation 140', the semiconductor device 50 may include a plurality of semiconductor devices 50-1, 50-2, 50-3 and 50-4. For example, in such embodiment shown in FIG. 17, the semiconductor device 50-1 is electrically connected to the semiconductor dies 130-1 and 130-3 and at least partially overlapped with each of the semiconductor dies 130-1 and 130-3 on the X-Y plane, the semiconductor device 50-2 is electrically connected to the semiconductor dies 130-1 and 130-2 and at least partially overlapped with each of the semiconductor dies 130-1 and 130-2 on the X-Y plane, the semiconductor device 50-3 is electrically connected to the semiconductor dies 130-3 and 130-4 and at least partially overlapped with each of the semiconductor dies 130-3 and 130-4 on the X-Y plane, and the semiconductor device 50-4 is electrically connected to the semiconductor dies 130-2 and 130-4 and at least partially overlapped with each of the semiconductor dies 130-2 and 130-4 on the X-Y plane. Due to the presence of the semiconductor devices 50-1 to 50-4, the semiconductor dies 130-1 to 130-4 may be electrically connected and communicated to each other. In one embodiment, the number of the recess R in the redistribution circuit structure 150 may be one, where all four of the semiconductor devices 50-1 to 50-4 are placed into the one same recess R. In an alternative embodiment, the number of the recess R in the redistribution circuit structure 150 may be four, where each of the semiconductor devices 50-1 to 50-4 is placed into a respective one recess of the four separate recesses R. In a further alternative embodiment, the number of the recess R in the redistribution circuit structure 150 may be two, where one of the semiconductor devices 50-1 to 50-4 is placed into a respective one recess of the two separate recesses R, and other three of the semiconductor devices 50-1 to 50-4 is placed into other one recess of the two separate recesses R. In a further alternative embodiment, the number of the recess R in the redistribution circuit structure 150 may be three, where two of the semiconductor devices 50-1 to 50-4 each are placed into a respective one recess of the three separate recesses R, and other two of the semiconductor devices 50-1 to 50-4 is placed into the last same recess of the three separate recesses R.

Figure 21:
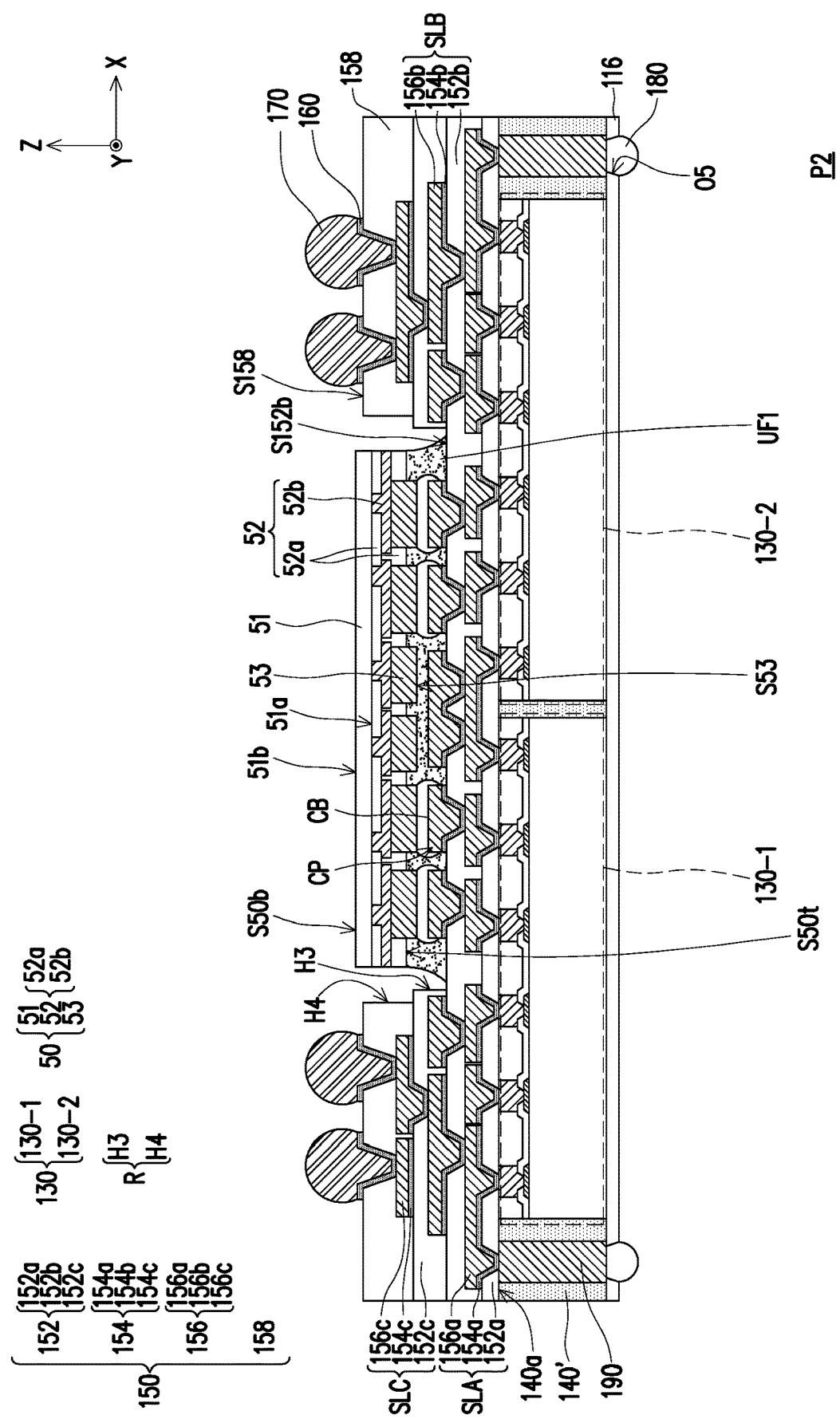
FIG. 21 is a schematic cross-sectional view of a package structure in accordance with some exemplary embodiments of the disclosure.

However, the disclosure is not limited thereto. In alternative embodiments, a plurality of conductive pillars 190 may be further included, see a package structure P3 depicted in FIG. 21. FIG. 21 is a schematic cross-sectional view of a package structure in accordance with some exemplary embodiments of the disclosure. Referring to FIG. 13 and FIG. 21 together, the package structure P1 depicted in FIG. 13 and the package structure P2 depicted in FIG. 21 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. With such embodiment of which the conductive pillars 190 are included as shown in FIG. 21, where the conductive pillars 190 are arranged aside of the semiconductor dies 130 along the direction X and are embedded in the insulating encapsulation 140'. The arrangement of the conductive pillars 190 may not be specifically limited in the disclosure, and may be selected and designated based on the demand and design layout. The conductive pillars 190 may be randomly disposed in the insulating encapsulation 140' and aside of the semiconductor dies 130. Alternatively, the conductive pillars 190 may be arranged into an array in the insulating encapsulation 140' and aside of the semiconductor dies 130. In some embodiments, the conductive pillars 190 may be through vias, such as through integrated fan-out (InFO) vias. For simplification, only two conductive pillars 190 are presented in FIG. 21 for illustrative purposes, however it should be noted that the number of the conductive pillars 190 may be less than two or more than two; the disclosure is not limited thereto. The number of the conductive pillars 190 to be formed can be selected based on the demand. Due to the presence of conductive pillars 190, a further routing function is provided to the semiconductor dies 130.

In some embodiments, two ends of each of the conductive pillars 190 are exposed by the insulating encapsulation 140'. For example, the conductive pillars 190 are sandwiched between the buffer layer 116 and the redistribution circuit structurer 150, where a first end of each the conductive pillars 190 is physically connected to the redistribution circuit structure 150, and the conductive pillars 190 are electrically connected to the semiconductor dies 130 through the redistribution circuit structure 150. In certain embodiments, the conductive pillars 190 may be further electrically connected to the semiconductor device 50 through the redistribution circuit structure 150. For example, the conductive pillars 190 are formed on the buffer layer 116 by photolithography, plating, photoresist stripping processes or any other suitable method. In one embodiment, the conductive pillars 190 may be formed by, but not limited to, forming a mask pattern (not shown) covering the buffer layer 116 with openings exposing portions of the buffer layer 116, forming a metallic material filling the openings to form the conductive pillars 190 by electroplating or deposition, and then removing the mask pattern. For example, the material of the conductive pillars 190 may include a metal material such as copper or copper alloys, or the like. However, the disclosure is not limited thereto.

Continued on FIG. 21, in some embodiments, a plurality of openings O5 are formed in the buffer layer 116 to exposing a second end of each of the conductive pillars 190. The number of the openings O5 is not limited in the disclosure, and may be designated based on the demand and design layout. In certain embodiments, a plurality of conductive elements 180 are respectively formed on the second end of each of the conductive pillars 190 exposed by the openings O5. The formation and material of the conductive elements 180 are the same or similar to the formation and material of the conductive elements 170, and thus are not repeated herein. As shown in FIG. 21, the conductive elements 180 are electrically connected to the semiconductor dies 130 through the conductive pillars 190 and the redistribution circuit structure 150. In certain embodiments, the conductive elements 180 may be further electrically connected to the semiconductor device 50 through the conductive pillars 190 and the redistribution circuit structure 150. After the conductive elements 180 are disposed on the conductive pillars 190, the package structure P2 having dual-side terminal is accomplished.

Figure 29:
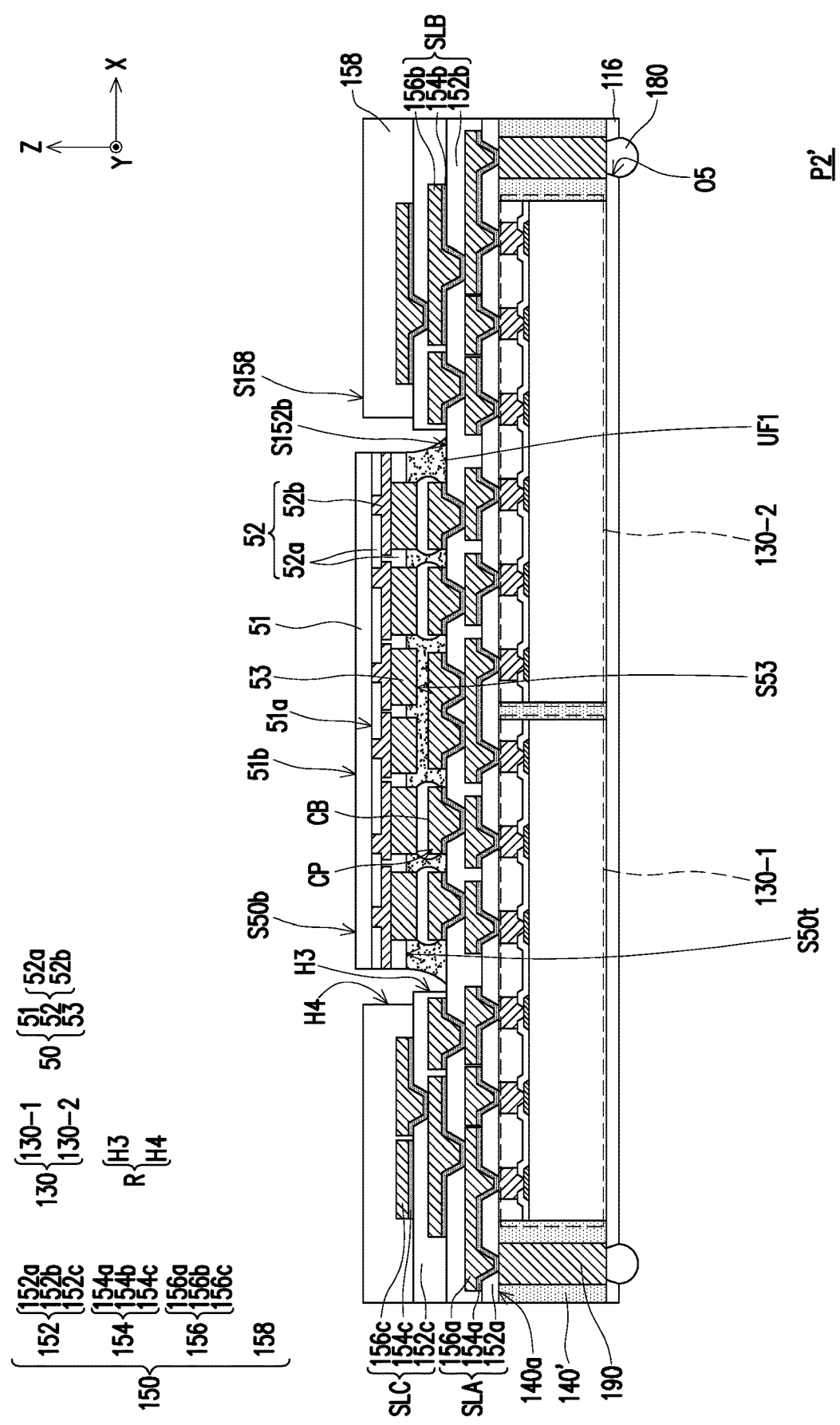
FIG. 29 is a schematic cross-sectional view of a package structure in accordance with some exemplary embodiments of the disclosure.

However, the disclosure is not limited thereto, in some alternative embodiments, the UBM patterns 160 and the conductive elements 170 are omitted, as shown in a package structure P2' of FIG. 29. In such embodiments, the openings O4 formed in the dielectric layer 158 are also omitted, as shown in FIG. 29. On the other hand, the openings O4 may be still formed in the dielectric layer 158.

Figure 30:
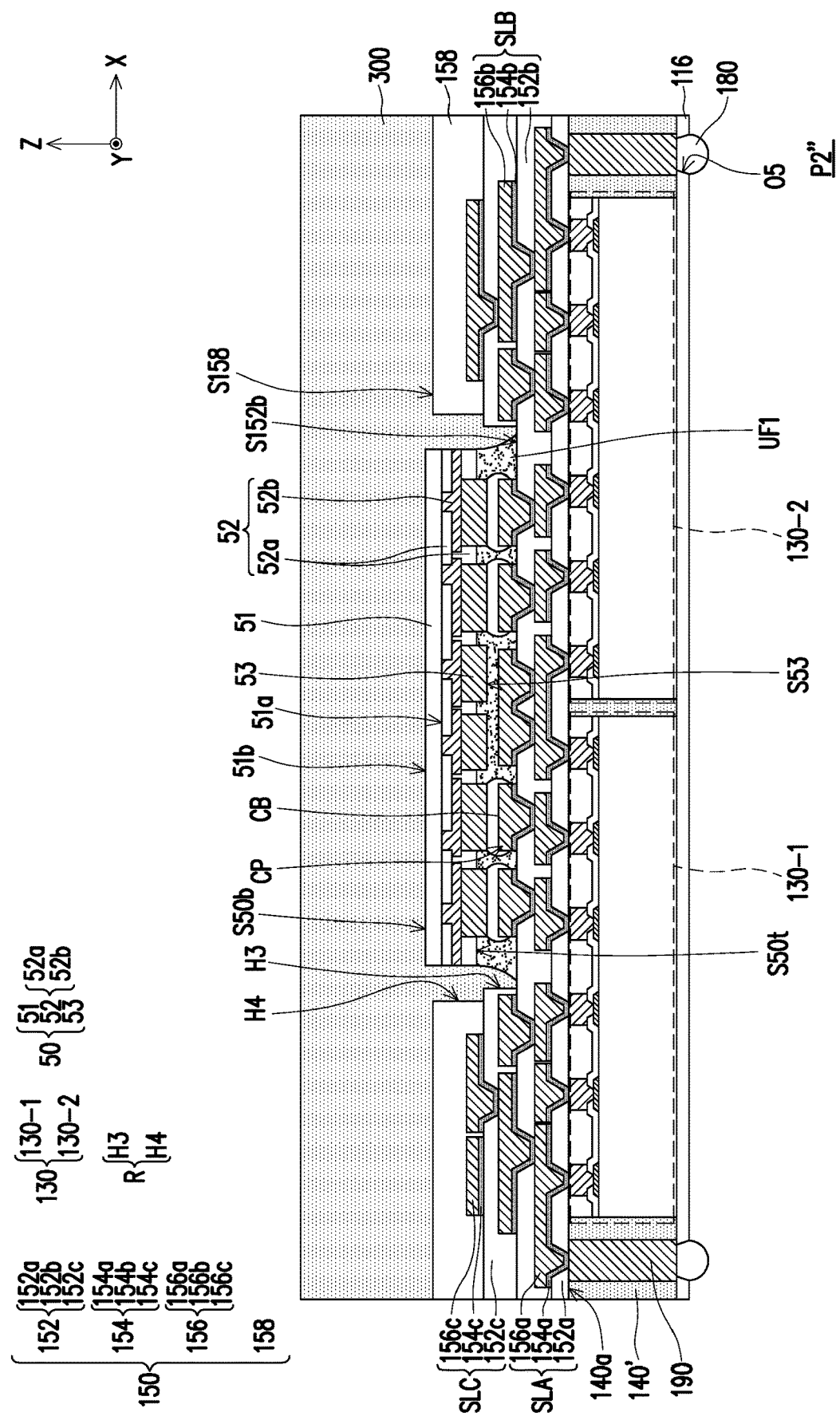
FIG. 30 is a schematic cross-sectional view of a package structure in accordance with some exemplary embodiments of the disclosure.

In further alternative embodiments, in addition to the omission of the UBM patterns 160 and the conductive elements 170, an insulating encapsulation 300 is included, see a package structure P2'' depicted in FIG. 30. In such embodiments, the insulating encapsulation 300 serves as a protection layer for preventing the semiconductor device 50 being damaged and securing the semiconductor device 50 on the redistribution circuit structure 150. The material and formation of the insulating encapsulation 300 may be the same as or similar to the material and formation of the insulating encapsulation 140, and thus are not repeated herein for brevity.

The disclosure is not limited thereto. In further alternative embodiments, an optional package, such a package including memory dies, may be bonded on the package structures P2, P2', P2'' through the conductive element 180 to obtain a Package-on Package (PoP) structure.

Figure 22:
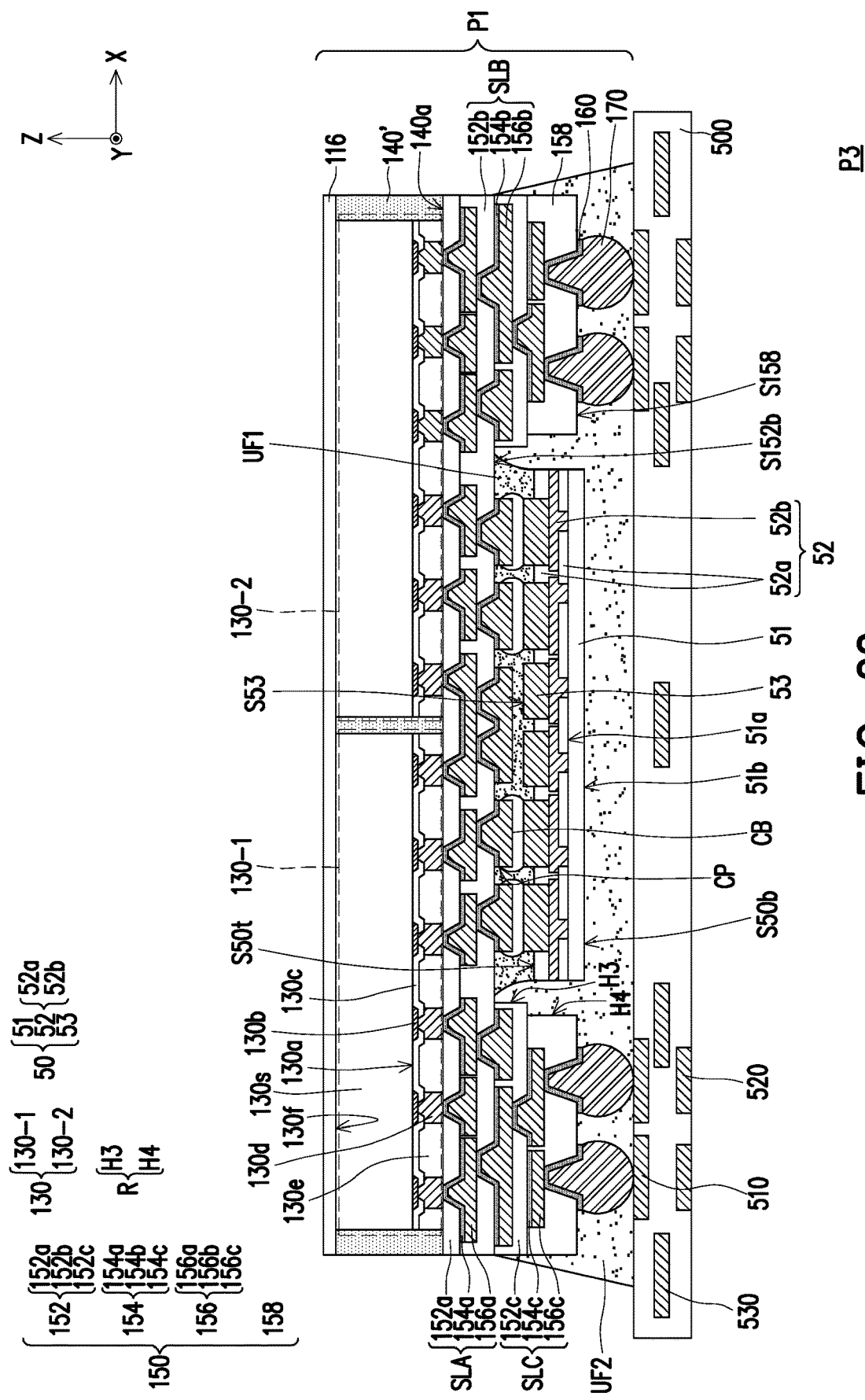
FIG. 22 is a schematic cross-sectional view of a package structure in accordance with some exemplary embodiments of the disclosure.

FIG. 22 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 22, in some embodiments, a substrate 500 is provided, where the package structure P1 depicted in FIG. 13 is bonded on the substrate 500 to form a package structure P3 having a stacked structure.

In some embodiments, the substrate 500 includes contact pads 510, contact pads 520, metallization layers 530 (including conductive trance and vias at least partially interconnected thereto). In some embodiments, the contact pads 510 and the contact pads 520 are respectively distributed on two opposite sides of the substrate 500 and are exposed for electrically connecting with later-formed elements and/or features. In some embodiments, the metallization layers 530 are embedded in the substrate 500 and provide routing function for the substrate 500, where the metallization layers 530 are electrically connected to the contact pads 510 and the contact pads 520. That is, at least some of the contact pads 510 are electrically connected to some of the contact pads 520 through the metallization layers 530. In some embodiments, the contact pads 510 and the contact pads 520 may include metal pads or metal alloy pads. In some embodiments, the materials of the metallization layers 530 may be substantially the same or similar to the material of the patterned conductive layers 156 or 52b, and thus are not repeated herein for simplicity.

In some embodiments, as shown in FIG. 22, in the formation of the package structure P3, the package structure P1 depicted in FIG. 13 is mounted to the substrate 500 through physically connecting the conductive element 170 and the contact pads 510, where the package structure P1 is physically and electrically connected to the substrate 500. The detail of the package structure P1 is described in FIG. 1 to FIG. 13, and thus are not repeated herein. In some embodiments, the substrate 500 is referred to as a circuit substrate, such as an organic flexible substrate or a printed circuit board. In such embodiments, the conductive elements 170 are, for example, chip connectors or BGA balls. In some embodiments, the substrate 500 is electrically connected to the semiconductor dies 130 through the contact pads 510, the conductive elements 170, and the redistribution circuit structure 150. In some embodiments, the substrate 500 is electrically connected to the semiconductor device 50 through the contact pads 510, the conductive elements 170, and the redistribution circuit structure 150. In some embodiments, the package structure P1 is bonded to the substrate 500 through physically connecting the conductive terminals 170 and the contact pads 510 of the substrate 500 by flip chip bonding.

In some embodiments, an underfill UF2 may be applied to fill the gaps between the package structure P1 and the substrate 500, which enhances the bonding strength between the package structure P1 and the substrate 500; thereby improving the reliability of the package structure P3 depicted FIG. 22. The formation and material of the underfill UF2 may be the same as or similar to the formation and material of the underfill UF1 described in FIG. 11, and thus are not repeated herein. In other embodiments, the underfill UF2 may be omitted, and the disclosure is not limited thereto.

In some alternative embodiments, a plurality of conductive terminals (not shown) are respectively formed on the substrate 500. For example, the conductive terminals are connected to the contact pads 520 of the substrate 500. In other words, the conductive terminals are electrically connected to the substrate 500 through the contact pads 520. Through the contact pads 510 and the contact pads 520, some of the conductive terminals are electrically connected to the package structure P1 (e.g. the semiconductor dies 130 or the semiconductor device 50). In some embodiments, the conductive terminals are, for example, solder balls or BGA balls.

Figure 23:
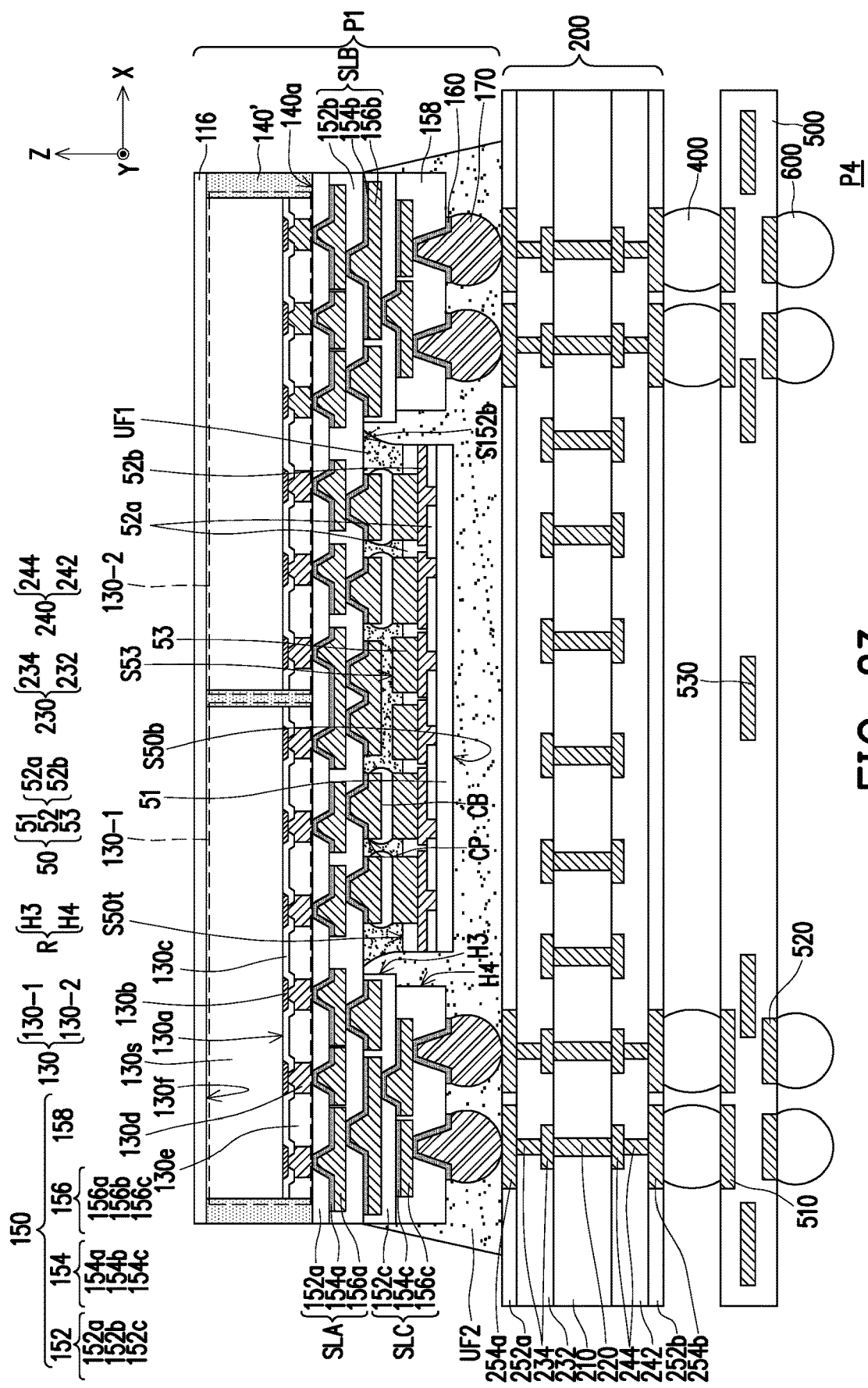
FIG. 23 is a schematic cross-sectional view of a package structure in accordance with some exemplary embodiments of the disclosure.

FIG. 23 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 23, in some embodiments, a circuit element 200 is provided, where the package structure P2 depicted in FIG. 16 is bonded on the circuit element 200 mounted to the substrate 500 to form the package structure P4 having a stacked structure.

The detail of the package structure P1 is described in FIGS. 1 to 13, and the detail of the substrate 500 is described in FIG. 22, and thus are not repeated herein. In some embodiments, a plurality of conductive terminals 600 are respectively formed on the substrate 500. As shown in FIG. 23, for example, the conductive terminals 600 are connected to the contact pads 520 of the substrate 500. In other words, the conductive terminals 600 are electrically connected to the substrate 500 through the contact pads 520. Through the contact pads 510 and the contact pads 520, some of the conductive terminals 600 are electrically connected to the package structure P1 (e.g. the semiconductor dies 130 included therein). In some embodiments, the conductive terminals 600 are, for example, solder balls or BGA balls. In some embodiments, the conductive terminals 600 is electrically connected to the semiconductor dies 130 through the contact pads 520, the metallization layers 530, the contact pads 510, the conductive elements 170, and the redistribution circuit structure 150. In some embodiments, the conductive terminals 600 is electrically connected to the semiconductor device 50 through the contact pads 520, the metallization layers 530, the contact pads 510, the conductive elements 170, and the redistribution circuit structure 150. In alternative embodiments, the conductive terminals 600 may be omitted, the disclosure is not limited thereto.

In some embodiments, the circuit element 200 includes a core portion 210, a plurality of vias 220, a redistribution circuit structure 230, a redistribution circuit structure 240, a solder mask layer 252a, a solder mask layer 252b, a plurality of bonding pads 254a, and a plurality of bonding pads 254b.

In some embodiments, the core portion 210 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 220 is through silicon vias penetrating the core portions 210. The circuit element 200 is referred to as an interposer (see FIG. 23), in the disclosure.

In some embodiments, the redistribution circuit structure 230 and the redistribution circuit structure 240 respectively disposed on two opposite sides of the core portion 210, as shown in FIG. 23. In some embodiments, the redistribution circuit structure 230 and/or the redistribution circuit structure 240 are electrically connected to the vias 220 penetrating the core portion 210. As shown in FIG. 23, the core portion 210 with the vias 220 embedded therein is located between the redistribution circuit structure 230 and the redistribution circuit structure 240, in some embodiments. Through the vias 220, the redistribution circuit structure 230 and the redistribution circuit structure 240 are electrically connected to each other.

In some embodiments, the redistribution circuit structure 230 includes a dielectric structure 232 (including one or more dielectric layers) and one or more metallization layers 234, where the metallization layers 234 are embedded in the dielectric structure 232, and one metallization layer 234 is sandwiched between two dielectric layers. That is, the metallization layers 234 and the dielectric layers of the dielectric structure 232 are sequentially formed in a manner of alternation. As shown in FIG. 23, portions of a top surface of a topmost layer of the metallization layers 234 are respectively exposed by openings formed in a topmost layer of the dielectric layers of the dielectric structure 232 for connecting with other conductive features, and portions of a bottom surface of a bottommost layer of the metallization layers 234 are respectively exposed by openings formed in a bottommost layer of the dielectric layers of the dielectric structure 232 for connecting with the vias 220. The numbers of the metallization layers and the dielectric layers included in the redistribution circuit structure 230 are not limited thereto, and may be designated and selected based on the demand.

In some embodiments, the redistribution circuit structure 240 includes a dielectric structure 242 (including one or more dielectric layers) and one or more metallization layers 244 in alternation, where the metallization layers 244 are embedded in the dielectric structure 242, and one metallization layer 244 is sandwiched between two dielectric layers 242. That is, the metallization layers 244 and the dielectric layers of the dielectric structure 242 are sequentially formed in a manner of alternation. As shown in FIG. 23, portions of a top surface of a topmost layer of the metallization layers 244 are respectively exposed by openings formed in a topmost layer of the dielectric layers of the dielectric structure 242 for connecting with the vias 220, and portions of a bottom surface of a bottommost layer of the metallization layers 244 are respectively exposed by openings formed in a bottommost layer of the dielectric layers of the dielectric structure 242 for connecting with other conductive features. The numbers of the metallization layers and the dielectric layers included in the redistribution circuit structure 240 are not limited thereto, and may be designated and selected based on the demand.

In certain embodiments, the materials of the dielectric layers 232 and the dielectric layers 242 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 232 and the dielectric layers 242 formed by suitable fabrication techniques such as spin-on coating, CVD, PECVD, or the like. The disclosure is not limited thereto. In one embodiment, the materials of the dielectric layers 232 and the dielectric layers 242 may be the same. In an alternative embodiment, the materials of the dielectric layers 232 and the dielectric layers 242 may be different.

In certain embodiments, the material of the metallization layers 234 and the metallization layers 244 may be made of conductive materials formed by electroplating or deposition, such as aluminum, titanium, copper, nickel, tungsten, and/or alloys thereof, which may be patterned using a photolithography and etching process. In some embodiments, the metallization layers 234 and the metallization layers 244 may be patterned copper layers or other suitable patterned metal layers. In one embodiment, the materials of the metallization layers 234 and the metallization layers 244 may be the same.

In an alternative embodiment, the materials of the metallization layers 234 and the metallization layers 244 may be different.

In some embodiments, the bonding pads 254a are disposed on a surface of the redistribution circuit structure 230 and physically connected to the portions of the top surface of the topmost layer of the metallization layers 234 exposed by the openings formed in the topmost layer of the dielectric layers of the dielectric structure 232, where the bonding pads 254a are physically separated from each other through the solder mask layer 252a formed on the surface of the redistribution circuit structure 230 with the bonding pads 254a disposed thereon. Through the redistribution circuit structure 230, the bonding pads 254a are electrically connected to the vias 220 embedded in the core portion 210.

In some embodiments, the bonding pads 254b are disposed on a surface of the redistribution circuit structure 240 and physically connected to the portions of the bottom surface of the bottommost layer of the metallization layers 244 exposed by the openings formed in the bottommost layer of the dielectric layers of the dielectric structure 242, where the bonding pads 254b are physically separated from each other through the solder mask layer 252b formed on the surface of the redistribution circuit structure 240 with the bonding pads 254b disposed thereon. Through the redistribution circuit structure 240, the bonding pads 254b are electrically connected to the vias 220 embedded in the core portion 210.

As shown in FIG. 23, for example, the bonding pads 254a are electrically connected to the redistribution circuit structure 230 and the bonding pads 254b are electrically connected to the redistribution circuit structure 240. In some embodiments, the bonding pads 254a and the bonding pads 254b may include under bump metallurgy (UBM) patterns, however the disclosure is not limited thereto. As shown in FIG. 19, the bonding pads 254a and the bonding pads 254b are electrically connected to each other though the vias 220, the redistribution circuit structure 230, and redistribution circuit structure 240, for example.

In an alternative embodiment, the redistribution circuit structure 230 and the redistribution circuit structure 240, one or both, may be omitted from the circuit element 200, the disclosure is not limited thereto. That is, for example, the circuit element 200 may include a core portion 210, a plurality of vias 220, a plurality of bonding pads 254a, a plurality of bonding pads 254b, a solder mask layer 252a, and a solder mask layer 252b, where the bonding pads 254a and the bonding pads 254b are electrically connected to each other though the vias 220.

In some embodiments, a plurality of conductive terminals 400 are respectively formed on the bonding pads 254b. As shown in FIG. 23, for example, the conductive terminals 400 are physically connected to the bonding pads 254b. In other words, the conductive terminals 400 are electrically connected to the circuit element 200 through the bonding pads 254b. Through the bonding pads 254b, some of the conductive terminals 400 are electrically connected to some of the bonding pads 254b. In some embodiments, the conductive terminals 400 are, for example, chip connectors or BGA balls.

Continued on FIG. 23, in some embodiments, the package structure P1 is physically connected to the circuit element 200 through connecting the conductive elements 170 and the bonding pads 254a of the circuit element 200, and the circuit element 200 is physically connected to the substrate 500 through connecting the conductive terminals 400 and the contact pads 510 of the substrate 500. In other words, the package structure P1 is electrically connected to the circuit element 200 through the conductive elements 170 and the bonding pads 254a, the circuit element 200 is electrically connected to the substrate 500 through the conductive terminals 400 and the contact pads 510, so that the package structure P1 is electrically connected to the substrate 500 through the conductive elements 170, the bonding pads 254a, the conductive terminals 400 and the contact pads 510. In certain embodiments, the package structure depicted in FIG. 23 may be formed by chip on wafer on substrate (CoWoS) packaging processes. In such embodiments, the conductive elements 170 are, for example, micro-bumps while the conductive terminals 400 are chip connectors and the conductive terminals 600 are solder balls or BGA balls; however, the disclosure is not limited thereto.

In some embodiments, the underfill UF2 is optimally formed on the circuit element 200. As shown in FIG. 23, for example, the underfill UF2 at least fills the gaps between the package structure P1 and the circuit element 200, and wraps sidewalls of the conductive elements 170. In some alternative embodiments, a sidewall of the package structure P1 may further covered by the underfill UF2, the disclosure is not limited thereto. Owing to the underfill UF2, the bonding strength between the package structure P1 and the circuit element 200 are enhanced, thereby improving the reliability of the package structure depicted FIG. 23. In alternative embodiments, the underfill UF2 may be omitted, and the disclosure is not limited thereto.

Figure 24:
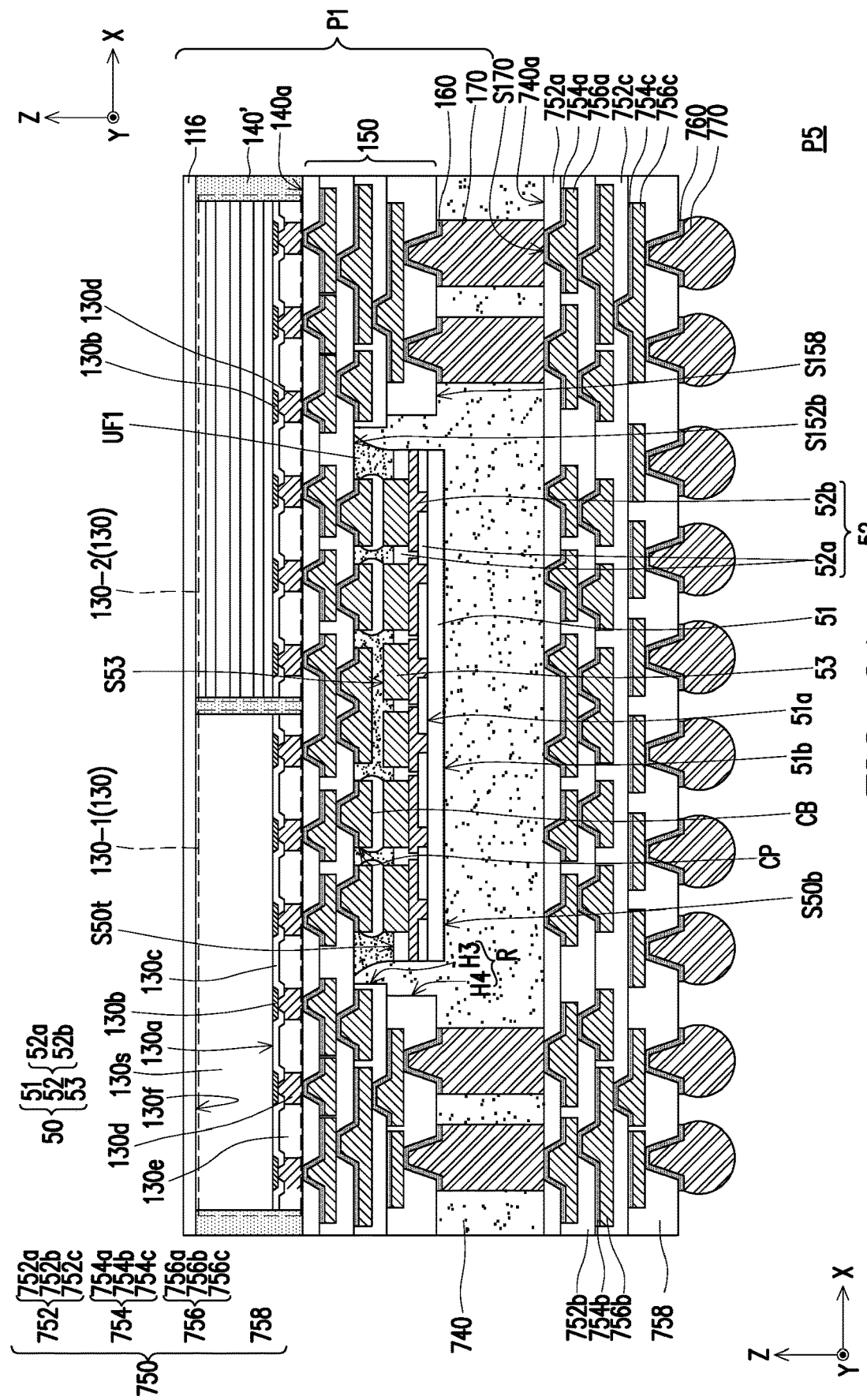
FIG. 24 is a schematic cross-sectional view of a package structure in accordance with some exemplary embodiments of the disclosure.
Figure 25:
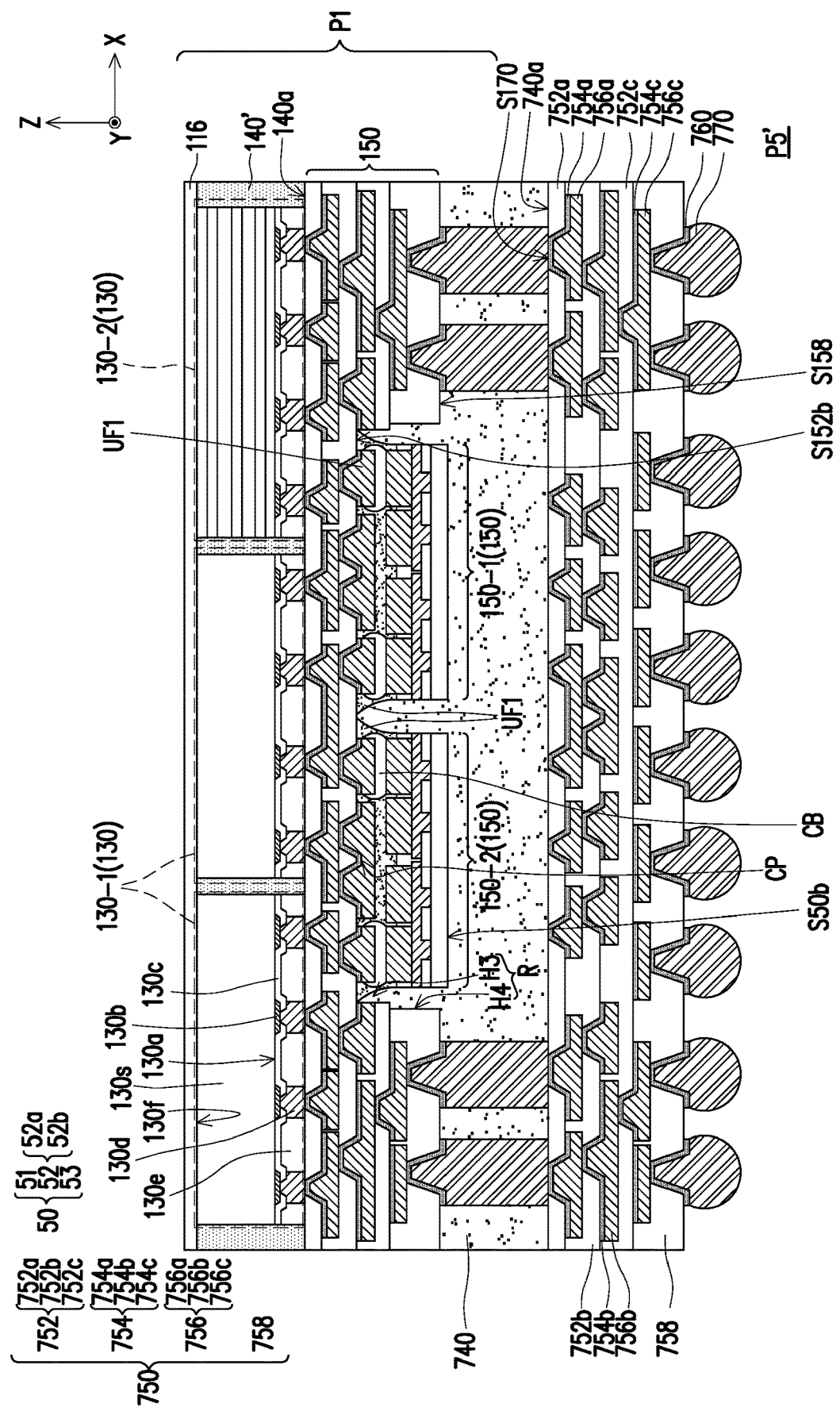
FIG. 25 is a schematic cross-sectional view of a package structure in accordance with some exemplary embodiments of the disclosure.
Figure 26:
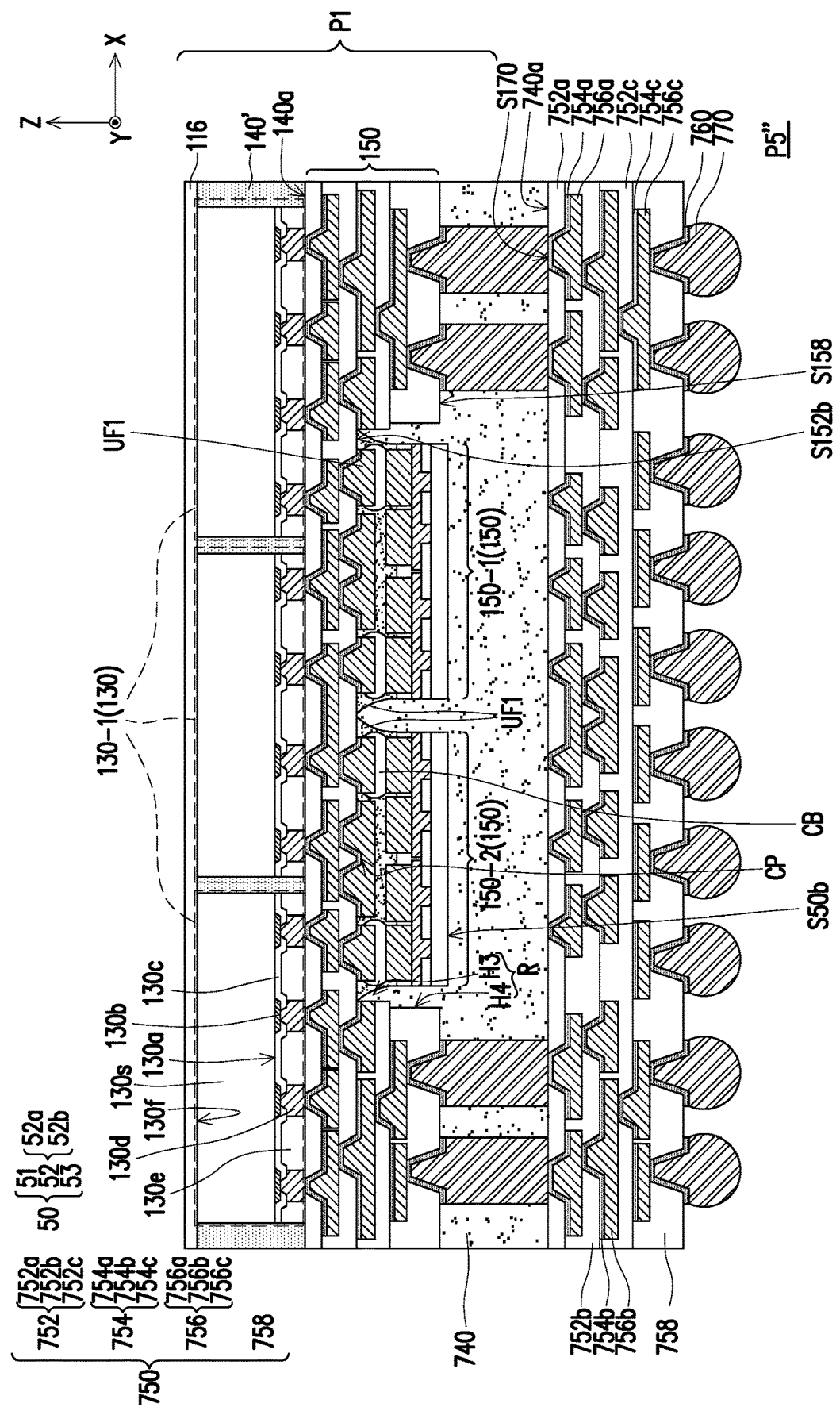
FIG. 26 is a schematic cross-sectional view of a package structure in accordance with some exemplary embodiments of the disclosure.

FIG. 24 is a schematic cross-sectional view of a package structure in accordance with some exemplary embodiments of the disclosure. FIG. 25 is a schematic cross-sectional view of a package structure in accordance with some exemplary embodiments of the disclosure. FIG. 26 is a schematic cross-sectional view of a package structure in accordance with some exemplary embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 13 and FIG. 24, a package structure P5 depicted in FIG. 24 is similar to the package structure P1 depicted in FIG. 13; the difference is that, in the package structure P5, the conductive elements 170 are formed in form of conductive pillars, an insulating encapsulation 740, a redistribution circuit structure 750, UBM patterns 760 and conductive elements 770 are further, in sequence, formed over the conductive elements 170 to form the package structure P5. In addition, in the package structure P5 as shown in FIG. 24, the semiconductor dies 130 (e.g., 130-1 and 130-2) are different from each other; for example, the semiconductor die 130-1 is a logic chip or the like while the semiconductor die 130-2 is a memory module (such as a HBM module having the conductive vias 130d as the terminals for electrical connection to other component(s)) or the like.

Referring to FIG. 24, in some embodiments, after the formation of the conductive elements 170, the insulating encapsulation 740 are formed over the conductive elements 170 and covers the redistribution circuit structurer 150 and the semiconductor device 50 exposed by the conductive elements 170. In some embodiments, a top surface 740a of the insulating encapsulation 740 is substantially leveled with the end surfaces S170 of the conductive elements 170. That is, the top surface 740a of the insulating encapsulation 740 is substantially coplanar to the end surfaces S170 of the conductive elements 170. For example, the conductive elements 170 is formed by electroplating or deposition, and may be made of a metal material such as copper or copper alloys, or the like. The formation and material of the conductive elements 170 in form of the conductive pillars may be the same or similar to the formation and material of the conductive pillars 190 as described in FIG. 21. The formation and material of the insulating encapsulation 740 are the same or similar to the formation and material of the insulating encapsulation 140' as described in FIG. 2 and FIG. 3, and thus are not repeating for brevity.

In some embodiments, as shown in FIG. 24, the redistribution circuit structure 750 is formed on the insulating encapsulation 740 and the conductive elements 170. In some embodiments, the redistribution circuit structure 750 includes one or more than one dielectric layer 752 (e.g. a dielectric layer 752*a*, a dielectric layer 752*b*, and a dielectric layer 752*c*), one or more than one seed layer 754 (e.g. a seed layer 754*a*, a seed layer 754*b*, and a seed layer 754*c*), a one or more than one patterned conductive layer 756 (e.g. a patterned conductive layer 756*a*, a patterned conductive layer 756*b*, and a patterned conductive layer 756*c*), and a dielectric layer 758. However, in the disclosure, the numbers of layers of the dielectric layer 752, the seed layer 754, and the patterned conductive layer 756 are not limited to what is depicted in FIG. 24, and may be selected or designated based on the demand and/or design layout. In some embodiments, one dielectric 752, one seed layer 754 and one patterned conductive layer 756 are sequentially formed between the insulating encapsulation 740 and the dielectric layer 758 along the direction Z in a repeating manner. The formation and material of the redistribution circuit structure 750 are the same or similar to the formation and material of the redistribution circuit structure 150 as described in FIG. 4 through FIG. 10, and thus are not repeating for brevity. As shown in FIG. 24, the redistribution circuit structure 750 is electrically connected to the redistribution circuit structure 150 through the conductive element 170, for example. In some embodiments, the redistribution circuit structure 750 is electrically connected to the semiconductor dies 130 (130-1, 130-2) and/or 50 through the conductive element 170 and the redistribution circuit structure 150.

In some embodiments, as shown in FIG. 24, after the formation of the redistribution circuit structure 750, the UBM patterns 760 and the conductive elements 770 are sequentially formed on the redistribution circuit structure 750. For example, the UBM patterns 760 are formed between the redistribution circuit structure 750 and the conductive elements 770. The formation and material of each of the UBM patterns 760 and the conductive elements 770 are the same or similar to the formation and material of each of the UBM patterns 160 and the conductive elements 170 as described in FIG. 11, and thus are not repeating for brevity. Due to the UBM patterns 760, the adhesive strength between the redistribution circuit structure 750 and the conductive elements 770 is enhanced. However, the disclosure is not limited thereto; in an alternative embodiment, the UBM patterns 760 may be omitted. In some embodiments, some of the conductive elements 770 are electrically connected to the semiconductor die 130-1. In some embodiments, some of the conductive elements 770 are electrically connected to the semiconductor die 130-2. In some embodiments, some of the conductive elements 770 are electrically connected to the semiconductor device 50. The semiconductor die 130-1 and the semiconductor die 130-2 may further electrically communicated through the redistribution circuit structure 750.

In the disclosure, it should be appreciated that the number of the semiconductor dies 130 may be more than two, where the number of the semiconductor die 130-1 (functioning as the logic chip) may be greater than, less than or equal to the number of the semiconductor die 130-2 (functioning as the memory chip or memory module). If considering the number of the semiconductor dies 130 is three, the combinations of the semiconductor dies 130-1 and 130-2 included in a package structure are, for example, two semiconductor dies 130-1 and one semiconductor die 130-2 (see a package structure P5' of FIG. 25), three semiconductor dies 130-1 (a package structure P5" of FIG. 26), three semiconductor dies 130-2 (e.g. no semiconductor die 130-1 (not shown)), or one semiconductor die 130-1 and two semiconductor dies 130-2 (not shown).

In addition, it should also be appreciated that the number of the semiconductor device 50 may be more than one. If considering there are two semiconductor devices 50 disposed in the recess R, the combinations of the semiconductor devices 50 included in a package structure are, for example, one semiconductor chip/IC (such as a digital chip, an analog chip or a mixed signal chip) and one SMD/IPD, one semiconductor chip/IC (such as a digital chip, an analog chip or a mixed signal chip) and one bridge element, or one SMD/IPD and one bridge element (see FIG. 25 and FIG. 26), or all are the same type selected from one of the semiconductor chip/IC, the SMD/IPD, or the bridge element.

In alternative embodiments, the package structures P1 depicted in FIG. 22 and/or FIG. 23 may be substituted with the package structure P1' depicted in FIG. 27, the package structure P1' depicted in FIG. 28, the package structure P2 depicted in FIG. 21, the package structure P5 depicted in FIG. 24, the package structure P5' depicted in FIG. 25, or the package structure P5" depicted in FIG. 26. The disclosure is not limited thereto.

In accordance with some embodiments, a package structure includes a first semiconductor die, a second semiconductor die, a redistribution circuit structure, and a semiconductor device. The redistribution circuit structure has a first surface and a second surface opposite to the first surface, wherein the first surface is in contact with the first semiconductor die and the second semiconductor die, and the redistribution circuit structure is disposed on and electrically connected to the first semiconductor die and the second semiconductor die and includes a recess extending from the second surface toward the first surface. The semiconductor device is located in the recess and electrically connected to the first semiconductor die and the second semiconductor die through the redistribution circuit structure.

In accordance with some embodiments, a package structure includes an insulating encapsulation, a plurality of semiconductor dies, a redistribution circuit structure, and at least one semiconductor device. The plurality of semiconductor dies are encapsulated in the insulating encapsulation. The redistribution circuit structure is located on the insulating encapsulation and has a first surface and a second surface opposite to the first surface, wherein the first surface is in contact with and electrically connected to the plurality of semiconductor dies, and the redistribution circuit structure includes a recess extending from the second surface toward the first surface. The at least one semiconductor device is located in the recess and electrically connected to the plurality of semiconductor dies through the redistribution circuit structure.

In accordance with some embodiments, a method of manufacturing package structure includes the following steps, providing a plurality of semiconductor dies; encapsulating the plurality of semiconductor dies in an insulating encapsulation; forming a redistribution circuit structure with a recess formed therein on the insulating encapsulation, wherein a thickness of the recess is less than a thickness of the redistribution circuit structure as measured along a stacking direction of the redistribution circuit structure and the insulating encapsulation; disposing at least one semiconductor device in the recess on the redistribution circuit structure to electrically connect to at least two of the plurality of semiconductor dies through the redistribution circuit structure; forming an under-ball metallurgy on the redistribution circuit structure; and disposing conductive elements on the under-ball metallurgy.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first semiconductor die and a second semiconductor die;
   a redistribution circuit structure, having a first surface and a second surface opposite to the first surface, the first surface being in contact with the first semiconductor die and the second semiconductor die, wherein the redistribution circuit structure is disposed on and electrically connected to the first semiconductor die and the second semiconductor die and comprises a recess extending from the second surface toward the first surface, wherein a sidewall of the recess is a step-shaped surface; and
   a semiconductor device, located in the recess and electrically connected to the first semiconductor die and the second semiconductor die through the redistribution circuit structure.

2. The package structure of claim 1, wherein along a stacking direction of the redistribution circuit structure and the first semiconductor die, a thickness of the recess is less than a thickness of the redistribution circuit structure,
   wherein a portion of the redistribution circuit structure is located between a bottom surface of the recess and the first semiconductor die and between the bottom surface of the recess and the second semiconductor die.

3. The package structure of claim 2, further comprising an underfill located in the recess, wherein the underfill covers the bottom surface of the recess.

4. The package structure of claim 3, wherein the underfill further covers at least a portion of a sidewall of the recess.

5. The package structure of claim 1, further comprising:
   an insulating encapsulation, laterally encapsulating the first semiconductor die and the second semiconductor die;
   conductive elements, located on the redistribution circuit structure, wherein the redistribution circuit structure is located between the insulating encapsulation and the conductive elements; and
   an under-ball metallurgy, located between the conductive elements and the redistribution circuit structure, and electrically connected the conductive elements and the redistribution circuit structure,
   wherein an electrical path distance between the semiconductor device to the first semiconductor die is less than an electrical path distance between the conductive elements to the first semiconductor die, and an electrical path distance measured between the semiconductor device to the second semiconductor die is less than an electrical path distance between the conductive elements to the second semiconductor die.

6. The package structure of claim 5, wherein the first semiconductor die comprises a plurality of first semiconductor dies, and the semiconductor device comprises one or more than one semiconductor device electrically connected to two of the first semiconductor dies and the second semiconductor die adjacent thereto through the redistribution circuit structure.

7. The package structure of claim 5, further comprising:
   a circuit structure, wherein the redistribution circuit structure is bonded to the circuit structure through the conductive elements.

8. The package structure of claim 5, further comprising:
   an interposer, having a plurality of conductive vias penetrating therethrough, bonded on and electrically connected to the redistribution circuit structure through the conductive elements; and
   a circuit substrate, bonded on and electrically connected to the interposer, wherein the interposer is located between the redistribution circuit structure and the circuit substrate.

9. The package structure of claim 1, wherein in a vertical projection on the redistribution circuit structure, a projection of the semiconductor device is overlapped with a portion of a projection of the first semiconductor die and a portion of a projection of the second semiconductor die.

10. The package structure of claim 1, wherein the first semiconductor die has a first active surface and a second semiconductor die has a second active surface laterally encapsulated in an insulating encapsulation, wherein the first active surface and the second active surface is substantially coplanar with a surface of the insulating encapsulation,
    wherein the first surface of redistribution circuit structure is in direct contact with the surface of the insulating encapsulation, the first active surface of the first semiconductor die, and the second active surface of the second semiconductor die.

11. A package structure, comprising:
    an insulating encapsulation;
    a plurality of semiconductor dies, encapsulated in the insulating encapsulation;
    a redistribution circuit structure, located on the insulating encapsulation and having a first surface and a second surface opposite to the first surface, the first surface being in contact with and electrically connected to the plurality of semiconductor dies, wherein the redistribution circuit structure comprises a recess extending from the second surface toward the first surface, wherein a sidewall of the recess is a step-shaped surface; and
    at least one semiconductor device, located in the recess and electrically connected to the plurality of semiconductor dies through the redistribution circuit structure.

12. The package structure of claim 11, wherein in a vertical projection on the redistribution circuit structure, a projection of the at least one semiconductor device is overlapped with a portion of a projection of each of the plurality of the semiconductor dies.

13. The package structure of claim 11, wherein the at least one semiconductor device comprises two or more than two semiconductor devices,
  wherein in a vertical projection on the redistribution circuit structure, a projection of each of the two or more than two semiconductor devices is overlapped with a portion of a projection of each of at least two semiconductor dies of the plurality of the semiconductor dies.

14. The package structure of claim 11, wherein a portion of the at least one semiconductor device is located outside the recess.

15. The package structure of claim 11, wherein a sidewall of the at least one semiconductor device is distant from a sidewall of the recess.

16. The package structure of claim 11, wherein along a stacking direction of the redistribution circuit structure and the insulating encapsulation, an opening of the recess is at a plane where the second surface of the redistribution circuit structure located at, and a bottom surface of the recess connecting to the opening through a sidewall of the recess is distant from the first surface of the redistribution circuit structure.

17. A method of manufacturing a package structure, comprising:
  providing a plurality of semiconductor dies;
  encapsulating the plurality of semiconductor dies in an insulating encapsulation;
  forming a redistribution circuit structure with a recess formed therein on the insulating encapsulation, wherein a thickness of the recess is less than a thickness of the redistribution circuit structure as measured along a stacking direction of the redistribution circuit structure and the insulating encapsulation, wherein a sidewall of the recess is a step-shaped surface;
  disposing at least one semiconductor device in the recess on the redistribution circuit structure to electrically connect to at least two of the plurality of semiconductor dies through the redistribution circuit structure;
  forming an under-ball metallurgy on the redistribution circuit structure; and
  disposing conductive elements on the under-ball metallurgy.

18. The method of claim 17, wherein forming the redistribution circuit structure with the recess formed therein on the insulating encapsulation comprises:
  forming a first dielectric layer with first openings on the insulating encapsulation;
  forming a first metallization layer on the first dielectric layer and extending into the first openings to electrically connect to the plurality of semiconductor dies;
  forming a second dielectric layer with second openings and holes on the first metallization layer;
  forming a second metallization layer on the second dielectric layer and extending into the second openings and the holes to electrically connect to the first metallization layer, wherein a portion of the second metallization layer corresponding to the holes comprises contact pads with the at least one semiconductor device disposed thereon;
  forming a third dielectric layer with third openings and a first trench on the second metallization layer, wherein the first trench corresponds to the holes and exposes the contact pads;
  forming a third metallization layer on the third dielectric layer outside the first trench and extending into the third openings to electrically connect to the second metallization layer; and
  forming a fourth dielectric layer with fourth openings and a second trench on the third metallization layer, wherein the first trench and the second trench are spatially communicated, and the second trench exposes the contact pads.

19. The method of claim 17, wherein forming the redistribution circuit structure with the recess formed therein on the insulating encapsulation comprises:
  forming a first dielectric layer with first openings on the insulating encapsulation;
  forming a first metallization layer on the first dielectric layer and extending into the first openings to electrically connect to the plurality of semiconductor dies;
  forming a second dielectric layer with second openings on the first metallization layer;
  forming a second metallization layer on the second dielectric layer and extending into the second openings to electrically connect to the first metallization layer;
  forming a third dielectric layer with third openings and a first trench on the second metallization layer, wherein forming the third dielectric layer with the third openings and the first trench further comprises forming holes in the second dielectric layer to exposes the first metallization layer, and the first trench corresponds to and exposes the holes;
  forming a third metallization layer on the third dielectric layer and extending into the third openings to electrically connect to the second metallization layer, wherein a portion of the third metallization layer is formed on the second dielectric layer and extends into the holes exposed by the first trench to form contact pads with the at least one semiconductor device disposed thereon; and
  forming a fourth dielectric layer with fourth openings and a second trench on the third metallization layer, wherein the first trench and the second trench are spatially communicated, and the second trench exposes the contact pads.

20. The method of claim 17, further comprising:
  forming an underfill in the recess by dispensing, wherein the underfill at least covers a portion of the redistribution circuit structure.

* * * * *